(12) United States Patent
Doering et al.

(10) Patent No.: US 9,096,930 B2
(45) Date of Patent: *Aug. 4, 2015

(54) APPARATUS FOR MANUFACTURING THIN FILM PHOTOVOLTAIC DEVICES

(75) Inventors: Kenneth B. Doering, San Jose, CA (US); Robert D. Wieting, Simi Valley, CA (US)

(73) Assignee: Stion Corporation, San Jose, CA (US)

( * ) Notice: Subject to any disclaimer, the term of this patent is extended or adjusted under 35 U.S.C. 154(b) by 947 days.

This patent is subject to a terminal disclaimer.

(21) Appl. No.: 13/185,401

(22) Filed: Jul. 18, 2011

(65) Prior Publication Data

US 2012/0003789 A1  Jan. 5, 2012

Related U.S. Application Data

(63) Continuation-in-part of application No. 13/049,114, filed on Mar. 16, 2011, now Pat. No. 8,142,521.

(60) Provisional application No. 61/318,750, filed on Mar. 29, 2010.

(51) Int. Cl.
*C23C 16/00* (2006.01)
*C23C 16/455* (2006.01)
*C23C 16/44* (2006.01)
(Continued)

(52) U.S. Cl.
CPC ....... *C23C 16/45512* (2013.01); *C23C 16/4401* (2013.01); *C23C 16/4585* (2013.01); *C23C 16/46* (2013.01); *H01L 31/18* (2013.01)

(58) Field of Classification Search
CPC ............ C23C 16/4401; C23C 16/4409; C23C 16/545; H01J 37/32513; H01J 37/32477
See application file for complete search history.

(56) References Cited

U.S. PATENT DOCUMENTS 3,520,732 A 7/1970 Nakayama et al.
3,828,722 A 8/1974 Reuter et al.
(Continued)

FOREIGN PATENT DOCUMENTS

AU 1998/78561 2/1999
AU 2001/40599 A1 8/2004
(Continued)

OTHER PUBLICATIONS

Baumann, A., et al., Photovoltaic Technology Review, presentation Dec. 6, 2004, 18 pages.
(Continued)

*Primary Examiner* — Gordon R Baldwin
*Assistant Examiner* — Charlee Bennett
(74) *Attorney, Agent, or Firm* — Kilpatrick Townsend & Stockton LLP

(57) ABSTRACT

An apparatus for fabricating thin film photovoltaic devices includes a deposition chamber for loading a pair of substrates. Two heater platens in a side-by-side configuration with a middle gap form intimate contact with the pair of substrates. Each heater platen has a second width and a second length respectively made smaller than the first width and the first length to allow the substrate to fully cover the heater platen for preventing formation of edge lip due to coating buildup in a peripheral edge region. The apparatus further includes a shield structure which covers both the middle gap and all outer peripheral side regions of the side-by-side configuration of the two heater platens for preventing coating buildup and guiding a downstream flow.

20 Claims, 19 Drawing Sheets

(51) Int. Cl.
    *C23C 16/458* (2006.01)
    *C23C 16/46* (2006.01)
    *H01L 31/18* (2006.01)

(56) References Cited

U.S. PATENT DOCUMENTS

| | | | |
|---|---|---|---|
| 3,975,211 A | 8/1976 | Shirland |
| 4,062,038 A | 12/1977 | Cuomo et al. |
| 4,204,933 A | 5/1980 | Barlow et al. |
| 4,213,781 A | 7/1980 | Noreika et al. |
| 4,239,553 A | 12/1980 | Barnett et al. |
| 4,263,336 A | 4/1981 | Thompson et al. |
| 4,332,974 A | 6/1982 | Fraas |
| 4,335,266 A | 6/1982 | Mickelsen et al. |
| 4,347,436 A | 8/1982 | Fukuda et al. |
| 4,441,113 A | 4/1984 | Madan |
| 4,442,310 A | 4/1984 | Carlson et al. |
| 4,461,922 A | 7/1984 | Gay et al. |
| 4,465,575 A | 8/1984 | Love et al. |
| 4,471,155 A | 9/1984 | Mohr et al. |
| 4,499,658 A | 2/1985 | Lewis |
| 4,502,225 A | 3/1985 | Lin |
| 4,507,181 A | 3/1985 | Nath et al. |
| 4,517,403 A | 5/1985 | Morel et al. |
| 4,518,855 A | 5/1985 | Malak |
| 4,542,255 A | 9/1985 | Tanner et al. |
| 4,581,108 A | 4/1986 | Kapur et al. |
| 4,589,194 A | 5/1986 | Roy |
| 4,598,306 A | 7/1986 | Nath et al. |
| 4,599,154 A | 7/1986 | Bender et al. |
| 4,611,091 A | 9/1986 | Choudary et al. |
| 4,612,411 A | 9/1986 | Wieting et al. |
| 4,623,601 A | 11/1986 | Lewis et al. |
| 4,625,070 A | 11/1986 | Berman et al. |
| 4,638,111 A | 1/1987 | Gay |
| 4,661,370 A | 4/1987 | Tarrant |
| 4,663,495 A | 5/1987 | Berman et al. |
| 4,705,912 A | 11/1987 | Nakashima et al. |
| 4,724,011 A | 2/1988 | Turner et al. |
| 4,727,047 A | 2/1988 | Bozler et al. |
| 4,751,149 A | 6/1988 | Vijayakumar et al. |
| 4,775,425 A | 10/1988 | Guha et al. |
| 4,793,283 A | 12/1988 | Sarkozy |
| 4,798,660 A | 1/1989 | Ermer et al. |
| 4,816,082 A | 3/1989 | Guha et al. |
| 4,816,420 A | 3/1989 | Bozler et al. |
| 4,865,999 A | 9/1989 | Xi et al. |
| 4,873,118 A | 10/1989 | Elias et al. |
| 4,915,745 A | 4/1990 | Pollock et al. |
| 4,950,615 A | 8/1990 | Basol et al. |
| 4,968,354 A | 11/1990 | Nishiura et al. |
| 4,996,108 A | 2/1991 | Divigalpitiya et al. |
| 5,008,062 A | 4/1991 | Anderson et al. |
| 5,011,565 A | 4/1991 | Dube et al. |
| 5,028,274 A | 7/1991 | Basol et al. |
| 5,039,353 A | 8/1991 | Schmitt |
| 5,045,409 A | 9/1991 | Eberspacher et al. |
| 5,069,727 A | 12/1991 | Kouzuma et al. |
| 5,078,803 A | 1/1992 | Pier et al. |
| 5,125,984 A | 6/1992 | Kruehler et al. |
| 5,133,809 A | 7/1992 | Sichanugrist et al. |
| 5,137,835 A | 8/1992 | Karg |
| 5,154,777 A | 10/1992 | Blackmom et al. |
| 5,180,686 A | 1/1993 | Banerjee et al. |
| 5,211,824 A | 5/1993 | Knapp |
| 5,217,564 A | 6/1993 | Bozler et al. |
| 5,231,047 A | 7/1993 | Ovshinsky et al. |
| 5,248,345 A | 9/1993 | Sichanugrist et al. |
| 5,259,883 A | 11/1993 | Yamabe et al. |
| 5,261,968 A | 11/1993 | Jordan |
| 5,298,086 A | 3/1994 | Guha et al. |
| 5,336,381 A | 8/1994 | Dalzell, Jr. et al. |
| 5,336,623 A | 8/1994 | Sichanugrist et al. |
| 5,346,853 A | 9/1994 | Guha et al. |
| 5,397,401 A | 3/1995 | Toma et al. |
| 5,399,504 A | 3/1995 | Ohsawa |
| 5,421,909 A | 6/1995 | Ishikawa et al. |
| 5,436,204 A | 7/1995 | Albin et al. |
| 5,445,847 A | 8/1995 | Wada |
| 5,474,939 A | 12/1995 | Pollock et al. |
| 5,482,571 A | 1/1996 | Yamada et al. |
| 5,501,744 A | 3/1996 | Albright et al. |
| 5,512,107 A | 4/1996 | van den Berg |
| 5,528,397 A | 6/1996 | Zavracy et al. |
| 5,536,333 A | 7/1996 | Foote et al. |
| 5,578,103 A | 11/1996 | Araujo et al. |
| 5,578,503 A | 11/1996 | Karg et al. |
| 5,589,006 A | 12/1996 | Itoyama et al. |
| 5,622,634 A | 4/1997 | Noma et al. |
| 5,626,688 A | 5/1997 | Probst et al. |
| 5,665,175 A | 9/1997 | Safir |
| 5,676,766 A | 10/1997 | Probst et al. |
| 5,698,496 A | 12/1997 | Fastnacht et al. |
| 5,726,065 A | 3/1998 | Szlufcik et al. |
| 5,738,731 A | 4/1998 | Shindo et al. |
| 5,855,974 A | 1/1999 | Wu et al. |
| 5,858,819 A | 1/1999 | Miyasaka |
| 5,868,869 A | 2/1999 | Albright et al. |
| 5,925,228 A | 7/1999 | Panitz et al. |
| 5,948,176 A | 9/1999 | Ramanathan et al. |
| 5,977,476 A | 11/1999 | Guha et al. |
| 5,981,868 A | 11/1999 | Kushiya et al. |
| 5,985,691 A | 11/1999 | Basol et al. |
| 6,001,744 A | 12/1999 | Doi |
| 6,035,101 A * | 3/2000 | Sajoto et al. ............. 392/416 |
| 6,040,521 A | 3/2000 | Kushiya et al. |
| 6,048,442 A | 4/2000 | Kushiya et al. |
| 6,077,722 A | 6/2000 | Jansen et al. |
| 6,092,669 A | 7/2000 | Kushiya et al. |
| 6,107,562 A | 8/2000 | Hashimoto et al. |
| 6,127,202 A | 10/2000 | Kapur et al. |
| 6,134,049 A | 10/2000 | Spiller et al. |
| 6,160,215 A | 12/2000 | Curtin |
| 6,166,319 A | 12/2000 | Matsuyama |
| 6,169,246 B1 | 1/2001 | Wu et al. |
| 6,172,297 B1 | 1/2001 | Hezel et al. |
| 6,258,620 B1 | 7/2001 | Morel et al. |
| 6,288,325 B1 | 9/2001 | Jansen et al. |
| 6,294,274 B1 | 9/2001 | Kawazoe et al. |
| 6,307,148 B1 | 10/2001 | Takeuchi et al. |
| 6,310,281 B1 | 10/2001 | Wendt et al. |
| 6,323,417 B1 | 11/2001 | Gillespie et al. |
| 6,328,871 B1 | 12/2001 | Ding et al. |
| RE37,512 E | 1/2002 | Szlufcik et al. |
| 6,335,479 B1 | 1/2002 | Yamada et al. |
| 6,336,991 B1 * | 1/2002 | Tamura et al. ........ 156/345.51 |
| 6,342,691 B1 * | 1/2002 | Johnsgard et al. .......... 219/390 |
| 6,361,718 B1 | 3/2002 | Shinmo et al. |
| 6,372,538 B1 | 4/2002 | Wendt et al. |
| 6,380,480 B1 | 4/2002 | Norimatsu et al. |
| 6,403,491 B1 * | 6/2002 | Liu et al. .................. 438/710 |
| 6,423,565 B1 | 7/2002 | Barth et al. |
| 6,537,845 B1 | 3/2003 | McCandless et al. |
| 6,616,767 B2 * | 9/2003 | Zhao et al. ............. 219/121.52 |
| 6,632,113 B1 | 10/2003 | Noma et al. |
| 6,635,307 B2 | 10/2003 | Huang et al. |
| 6,653,701 B1 | 11/2003 | Yamazaki et al. |
| 6,667,492 B1 | 12/2003 | Kendall |
| 6,690,041 B2 | 2/2004 | Armstrong et al. |
| 6,692,820 B2 | 2/2004 | Forrest et al. |
| 6,784,492 B1 | 8/2004 | Morishita |
| 6,852,920 B2 | 2/2005 | Sager et al. |
| 6,878,871 B2 | 4/2005 | Scher et al. |
| 6,962,348 B2 * | 11/2005 | Fink .......................... 277/608 |
| 6,974,976 B2 | 12/2005 | Hollars |
| 7,122,398 B1 | 10/2006 | Pichler |
| 7,179,677 B2 | 2/2007 | Ramanathan et al. |
| 7,194,197 B1 | 3/2007 | Wendt et al. |
| 7,220,321 B2 | 5/2007 | Barth et al. |
| 7,235,736 B1 | 6/2007 | Buller et al. |
| 7,252,923 B2 | 8/2007 | Kobayashi |
| 7,265,037 B2 | 9/2007 | Yang et al. |
| 7,303,788 B2 | 12/2007 | Kataoka et al. |
| 7,319,190 B2 | 1/2008 | Tuttle |

(56) References Cited

U.S. PATENT DOCUMENTS

| | | | |
|---|---|---|---|
| 7,364,808 B2 | 4/2008 | Sato et al. | |
| 7,422,637 B2 * | 9/2008 | Ku et al. | 118/728 |
| 7,441,413 B2 | 10/2008 | Bae et al. | |
| 7,442,413 B2 | 10/2008 | Zwaap et al. | |
| 7,544,884 B2 | 6/2009 | Hollars | |
| 7,576,017 B2 | 8/2009 | Tuttle | |
| 7,736,755 B2 | 6/2010 | Igarashi et al. | |
| 7,741,560 B2 | 6/2010 | Yonezawa | |
| 7,846,750 B2 | 12/2010 | Boyer | |
| 7,855,089 B2 | 12/2010 | Farris, III et al. | |
| 7,863,074 B2 | 1/2011 | Wieting | |
| 7,863,518 B2 | 1/2011 | Terakawa et al. | |
| 7,875,945 B2 | 1/2011 | Krasnov et al. | |
| 7,910,399 B1 | 3/2011 | Wieting | |
| 7,955,891 B2 | 6/2011 | Wieting | |
| 7,960,204 B2 | 6/2011 | Lee | |
| 7,993,954 B2 | 8/2011 | Wieting | |
| 7,993,955 B2 | 8/2011 | Wieting | |
| 7,998,762 B1 | 8/2011 | Lee et al. | |
| 8,003,430 B1 | 8/2011 | Lee | |
| 8,008,110 B1 | 8/2011 | Lee | |
| 8,008,111 B1 | 8/2011 | Lee | |
| 8,008,112 B1 | 8/2011 | Lee | |
| 8,017,860 B2 | 9/2011 | Lee | |
| 8,026,122 B1 | 9/2011 | Lee | |
| 8,142,521 B2 * | 3/2012 | Wieting et al. | 29/25.02 |
| 8,168,463 B2 | 5/2012 | Wieting | |
| 8,178,370 B2 | 5/2012 | Lee et al. | |
| 8,183,066 B2 | 5/2012 | Lee et al. | |
| 8,217,261 B2 | 7/2012 | Wieting | |
| 8,263,494 B2 | 9/2012 | Patterson | |
| 8,287,942 B1 | 10/2012 | Huang et al. | |
| 2002/0002992 A1 | 1/2002 | Kariya et al. | |
| 2002/0004302 A1 | 1/2002 | Fukumoto | |
| 2002/0061361 A1 | 5/2002 | Nakahara et al. | |
| 2002/0063065 A1 | 5/2002 | Sonoda et al. | |
| 2003/0075717 A1 | 4/2003 | Kondo et al. | |
| 2003/0089899 A1 | 5/2003 | Lieber et al. | |
| 2003/0188777 A1 | 10/2003 | Gaudiana et al. | |
| 2003/0230338 A1 | 12/2003 | Menezes | |
| 2004/0063320 A1 | 4/2004 | Hollars | |
| 2004/0084080 A1 | 5/2004 | Sager et al. | |
| 2004/0095658 A1 | 5/2004 | Buretea et al. | |
| 2004/0110393 A1 | 6/2004 | Munzer et al. | |
| 2004/0161539 A1 | 8/2004 | Miyakawa | |
| 2004/0187917 A1 | 9/2004 | Pichler | |
| 2004/0191949 A1 | 9/2004 | Iwata et al. | |
| 2004/0191950 A1 | 9/2004 | Nakamura et al. | |
| 2004/0245912 A1 | 12/2004 | Thurk et al. | |
| 2004/0252488 A1 | 12/2004 | Thurk | |
| 2004/0256001 A1 | 12/2004 | Mitra et al. | |
| 2005/0074915 A1 | 4/2005 | Tuttle et al. | |
| 2005/0098205 A1 | 5/2005 | Roscheisen et al. | |
| 2005/0109392 A1 | 5/2005 | Hollars | |
| 2005/0164432 A1 | 7/2005 | Lieber et al. | |
| 2005/0194036 A1 | 9/2005 | Basol | |
| 2005/0223570 A1 | 10/2005 | Yonezawa et al. | |
| 2005/0287717 A1 | 12/2005 | Heald et al. | |
| 2006/0034065 A1 | 2/2006 | Thurk | |
| 2006/0040103 A1 | 2/2006 | Whiteford et al. | |
| 2006/0051505 A1 | 3/2006 | Kortshagen et al. | |
| 2006/0096536 A1 | 5/2006 | Tuttle | |
| 2006/0096537 A1 | 5/2006 | Tuttle | |
| 2006/0096635 A1 | 5/2006 | Tuttle | |
| 2006/0102230 A1 | 5/2006 | Tuttle | |
| 2006/0112983 A1 | 6/2006 | Parce et al. | |
| 2006/0130890 A1 | 6/2006 | Hantschel et al. | |
| 2006/0160261 A1 | 7/2006 | Sheats et al. | |
| 2006/0173113 A1 | 8/2006 | Yabuta et al. | |
| 2006/0174932 A1 | 8/2006 | Usui et al. | |
| 2006/0219288 A1 | 10/2006 | Tuttle | |
| 2006/0219547 A1 | 10/2006 | Tuttle | |
| 2006/0220059 A1 | 10/2006 | Satoh et al. | |
| 2006/0249202 A1 | 11/2006 | Yoo et al. | |
| 2006/0267054 A1 | 11/2006 | Martin et al. | |
| 2007/0004078 A1 | 1/2007 | Alberts | |
| 2007/0006914 A1 | 1/2007 | Lee | |
| 2007/0089782 A1 | 4/2007 | Scheuten et al. | |
| 2007/0116892 A1 | 5/2007 | Zwaap et al. | |
| 2007/0116893 A1 | 5/2007 | Zwaap | |
| 2007/0151596 A1 | 7/2007 | Nasuno et al. | |
| 2007/0163643 A1 | 7/2007 | Van Duren et al. | |
| 2007/0169810 A1 | 7/2007 | Van Duern et al. | |
| 2007/0193623 A1 | 8/2007 | Krasnov | |
| 2007/0209700 A1 | 9/2007 | Yonezawa et al. | |
| 2007/0241512 A1 * | 10/2007 | Tsuboi | 277/370 |
| 2007/0243657 A1 | 10/2007 | Basol et al. | |
| 2007/0264488 A1 | 11/2007 | Lee | |
| 2007/0283998 A1 | 12/2007 | Kuriyagawa et al. | |
| 2007/0289624 A1 | 12/2007 | Kuriyagawa et al. | |
| 2008/0029154 A1 | 2/2008 | Mishtein et al. | |
| 2008/0032044 A1 | 2/2008 | Kuriyagawa et al. | |
| 2008/0041446 A1 | 2/2008 | Wu et al. | |
| 2008/0057616 A1 | 3/2008 | Robinson et al. | |
| 2008/0092945 A1 | 4/2008 | Munteanu et al. | |
| 2008/0092953 A1 | 4/2008 | Lee | |
| 2008/0092954 A1 | 4/2008 | Choi | |
| 2008/0105294 A1 | 5/2008 | Kushiya et al. | |
| 2008/0110491 A1 | 5/2008 | Buller et al. | |
| 2008/0110495 A1 | 5/2008 | Onodera et al. | |
| 2008/0115827 A1 | 5/2008 | Woods et al. | |
| 2008/0121264 A1 | 5/2008 | Chen et al. | |
| 2008/0121277 A1 | 5/2008 | Robinson et al. | |
| 2008/0204696 A1 | 8/2008 | Kamijima | |
| 2008/0210303 A1 | 9/2008 | Lu et al. | |
| 2008/0216886 A1 | 9/2008 | Iwakura | |
| 2008/0280030 A1 | 11/2008 | Van Duren et al. | |
| 2008/0283389 A1 | 11/2008 | Aoki | |
| 2008/0311294 A1 * | 12/2008 | Ito et al. | 427/248.1 |
| 2009/0021157 A1 | 1/2009 | Kim et al. | |
| 2009/0058295 A1 | 3/2009 | Auday et al. | |
| 2009/0084438 A1 | 4/2009 | den Boer et al. | |
| 2009/0087940 A1 | 4/2009 | Kushiya | |
| 2009/0087942 A1 | 4/2009 | Meyers | |
| 2009/0145746 A1 | 6/2009 | Hollars | |
| 2009/0217969 A1 | 9/2009 | Matsushima et al. | |
| 2009/0234987 A1 | 9/2009 | Lee et al. | |
| 2009/0235983 A1 | 9/2009 | Girt et al. | |
| 2009/0235987 A1 | 9/2009 | Akhtar et al. | |
| 2009/0293945 A1 | 12/2009 | Peter | |
| 2010/0081230 A1 | 4/2010 | Lee | |
| 2010/0087016 A1 | 4/2010 | Britt et al. | |
| 2010/0087026 A1 | 4/2010 | Winkeler et al. | |
| 2010/0087027 A1 | 4/2010 | Wieting | |
| 2010/0096007 A1 | 4/2010 | Mattmann et al. | |
| 2010/0101648 A1 | 4/2010 | Morooka et al. | |
| 2010/0101649 A1 | 4/2010 | Huignard et al. | |
| 2010/0122726 A1 | 5/2010 | Lee | |
| 2010/0197051 A1 | 8/2010 | Schlezinger et al. | |
| 2010/0210064 A1 | 8/2010 | Hakuma et al. | |
| 2010/0224247 A1 | 9/2010 | Bartholomeusz et al. | |
| 2010/0233386 A1 | 9/2010 | Krause et al. | |
| 2010/0258179 A1 | 10/2010 | Wieting | |
| 2010/0267189 A1 | 10/2010 | Yu et al. | |
| 2010/0267190 A1 | 10/2010 | Hakuma et al. | |
| 2010/0297798 A1 | 11/2010 | Adriani et al. | |
| 2011/0018103 A1 | 1/2011 | Wieting | |
| 2011/0020980 A1 | 1/2011 | Wieting | |
| 2011/0070682 A1 | 3/2011 | Wieting | |
| 2011/0070683 A1 | 3/2011 | Wieting | |
| 2011/0070684 A1 | 3/2011 | Wieting | |
| 2011/0070685 A1 | 3/2011 | Wieting | |
| 2011/0070686 A1 | 3/2011 | Wieting | |
| 2011/0070687 A1 | 3/2011 | Wieting | |
| 2011/0070688 A1 | 3/2011 | Wieting | |
| 2011/0070689 A1 | 3/2011 | Wieting | |
| 2011/0070690 A1 | 3/2011 | Wieting | |
| 2011/0071659 A1 | 3/2011 | Farris, III et al. | |
| 2011/0073181 A1 | 3/2011 | Wieting | |
| 2011/0177622 A1 * | 7/2011 | Britt et al. | 438/5 |
| 2011/0203634 A1 | 8/2011 | Wieting | |
| 2011/0212565 A1 | 9/2011 | Wieting | |
| 2011/0259395 A1 | 10/2011 | Wieting et al. | |
| 2011/0259413 A1 | 10/2011 | Wieting et al. | |

(56) References Cited

U.S. PATENT DOCUMENTS

| | | |
|---|---|---|
| 2011/0269260 A1 | 11/2011 | Buquing |
| 2011/0277836 A1 | 11/2011 | Lee |
| 2012/0018828 A1 | 1/2012 | Shao |
| 2012/0021552 A1 | 1/2012 | Alexander et al. |
| 2012/0094432 A1 | 4/2012 | Wieting |
| 2012/0122304 A1 | 5/2012 | Wieting |
| 2012/0186975 A1 | 7/2012 | Lee et al. |
| 2012/0240989 A1 | 9/2012 | Ramanathan et al. |
| 2012/0270341 A1 | 10/2012 | Lee et al. |

FOREIGN PATENT DOCUMENTS

| | | |
|---|---|---|
| DE | 3314197 A1 | 11/1983 |
| DE | 10104726 A1 | 8/2002 |
| DE | 102005062977 B3 | 9/2007 |
| FR | 2646560 | 11/1990 |
| GB | 2124826 A | 2/1984 |
| JP | 2000/173969 | 6/2000 |
| JP | 2000/219512 | 8/2000 |
| JP | 2002/167695 | 6/2002 |
| JP | 2002/270871 | 9/2002 |
| JP | 2002/299670 | 10/2002 |
| JP | 2004/332043 | 11/2004 |
| JP | 2005/311292 | 11/2005 |
| WO | 01/57932 A1 | 8/2001 |
| WO | 2005/011002 | 2/2005 |
| WO | 2006/126598 A1 | 11/2006 |
| WO | 2007/022221 A2 | 2/2007 |
| WO | 2007/077171 A2 | 7/2007 |
| WO | 2008/025326 A2 | 3/2008 |

OTHER PUBLICATIONS

Chopra et al., "Thin-Film Solar Cells: An Overview", 2004, Progress in Photovoltaics: Research and Applications, 2004, vol. 12, pp. 69-92.

Guillen C., "$CuInS_2$ Thin Films Grown Sequentially from Binary Sulfides as Compared to Layers Evaporated Directly from the Elements", Semiconductor Science and Technology, vol. 21, No. 5, May 2006, pp. 709-712.

Huang et al., Photoluminescence and Electroluminescence of ZnS:Cu Nanocrystals in Polymeric Networks, Applied Physics, Lett. 70 (18), May 5, 1997, pp. 2335-2337.

Huang et al., Preparation of $Zn_xCd_{1-x}S$ Nanocomposites in Polymer Matrices and their Photophysical Properties, Langmuir 1998, 14, pp. 4342-4344.

International Solar Electric Technology, Inc. (ISET) "Thin Film CIGS", Retrieved from http://www.isetinc.com/cigs.html on Oct. 1, 2008, 4 pages.

Kapur et al., "Fabrication of CIGS Solar Cells via Printing of Nanoparticle Precursor Inks", DOE Solar Program Review Meeting 2004, DOE/GO-102005-2067, p. 135-136.

Kapur et al., "Non-Vacuum Printing Process for CIGS Solar Cells on Rigid and Flexible Substrates", 29th IEEE Photovoltaic Specialists Conf., New Orleans, LA, IEEE, 2002, pp. 688-691.

Kapur et al., "Non-Vacuum Processing of CIGS Solar Cells on Flexible Polymer Substrates", Proceedings on the Third World Conference on Photovoltaic Energy Conversion, Osaka, Japan, 2P-D3-43, 2003.

Kapur et al., "Non-Vacuum Processing of $CuIn_{1-x}G_xSe_2$ Solar Cells on Rigid and Flexible Substrates using Nanoparticle Precursor Inks", Thin Solid Films, 2003, vol. 431-432, pp. 53-57.

Kapur et al., "Fabrication of Light Weight Flexible CIGS Solar Cells for Space Power Applications", Materials Research Society, Proceedings vol. 668, (2001) pp. H3.5.1-H3.5.6.

Kapur et al., "Nanoparticle Oxides Precursor Inks for Thin Film Copper Indium Gallium Selenide (CIGS) Solar Cells", Materials Research Society Proceedings, vol. 668, (2001) pp. H2.6.1-H2.6.7.

Mehta et al., "A graded diameter and oriented nanorod-thin film structure for solar cell application: a device proposal", Solar Energy Materials & Solar Cells, 2005, vol. 85, pp. 107-113.

Salvador, "Hole diffusion length in $n$-$TiO2$ single crystals and sintered electrodes: photoelectrochemical determination and comparative analysis," Journal of Applied Physics, vol. 55, No. 8, pp. 2977-2985, Apr. 15, 1984.

Srikant V., et al., "On the Optical Band Gap of Zinc Oxide", Journal of Applied Physics, vol. 83, No. 10, May 15, 1998, pp. 5447-5451.

Yang et al., "Preparation, Characterization and Electroluminescence of ZnS Nanocrystals in a Polymer Matrix", Journal Material Chem., 1997, vol. 7, No. 1, pp. 131-133.

Yang et al., "Electroluminescence from ZnS/CdS Nanocrystals/Polymer Composite", Synthetic Metals 1997, vol. 91, pp. 347-349.

Yang et al., "Fabrication and Chacteristics of ZnS Nanocrystals/Polymer Composite Doped with Tetraphenylbenzidine Single Layer Structure Light-emitting Diode", Applied Physics Letters, vol. 69, No. 3, Jul. 15, 1996, pp. 377-379.

Ellmer et al., Copper Indium Disulfide Solar Cell Absorbers Prepared in a One-Step Process by Reactive Magnetron Sputtering from Copper and Indium Targets; Elsevier Science B.V; Thin Solid Films 413 (2002) pp. 92-97.

Gordillo et al. "Electrical and morphological properties of low resistivity Mo thin films prepared by magnetron sputtering," 9Brazilian Journal of Physics 36:982-985 (Sep. 2006).

Grecu et al. "Spectroscopic Characterization of Chemical Bath Deposited Cadmium Sulphide Layers", Journal of Optoelectronics and Advanced Matenals 6:127 -132 (Mar. 2004).

Onuma et al., Preparation and Characterization of CuInS Thin Films Solar Cells with Large Grain, Elsevier Science B.V; Solar Energy Materials & Solar Cells 69 (2001) pp. 261-269.

Palm et al. "Second generation CIS solar modules," Solar Energy 77:757-765 (Dec. 2004).

Scofield "Sodium diffusion, selenization, and microstructural effects associated with various molybdenum back contact layers for CIS-based solar cells", Proceedings of the 24th IEEE Photovoltaic Specialists Conference, pp. 164-167 (1995).

\* cited by examiner

SECTION A-A

APPARATUS FOR MANUFACTURING THIN FILM PHOTOVOLTAIC DEVICES

CROSS-REFERENCE TO RELATED APPLICATIONS

This application is a continuation-in-part application of U.S. patent application Ser. No. 13/049,114, filed Mar. 16, 2011 and claims priority to U.S. Provisional Application No. 61/318,750, filed Mar. 29, 2010 by Robert D. Wieting, et. al., commonly assigned, and hereby incorporated by reference in its entirety herein for all purpose.

BACKGROUND OF THE INVENTION

The present invention relates generally to photovoltaic techniques. More particularly, the present invention provides a large scale system and method for manufacturing a thin film photovoltaic device using copper indium diselenide species (CIS), copper indium gallium diselenide species (CIGS), and/or others. Merely by example, embodiments of the present invention are applied to implement a Metal-Organic Chemical Vapor Deposition system for depositing metal oxide materials for manufacturing thin film photovoltaic devices on large scale substrate panels.

In the process of manufacturing CIS and/or CIGS types of thin films, there are various manufacturing challenges, such as scaling up the manufacturing to large substrate panels while maintaining structure integrity of substrate materials, ensuring uniformity and granularity of the thin film material, etc. While conventional techniques in the past have addressed some of these issues, they are often inadequate in various situations. Therefore, it is desirable to have improved systems and method for manufacturing thin film photovoltaic devices.

BRIEF SUMMARY OF THE INVENTION

This invention provides a method and a large scale system of chemical vapor deposition for fabricating thin-film photovoltaic devices based on copper indium diselenide species (CIS), copper indium gallium diselenide species (CIGS), and/or others. The invention can be applied to photovoltaic modules, flexible sheets, building or window glass, automotive, and others.

The invention provides an apparatus for fabricating thin film photovoltaic devices on substrate panels. The apparatus includes a deposition chamber enclosed by sidewalls, a lid structure, and a base structure. The deposition chamber is supported by a support structure. The apparatus further includes a mixing chamber above the lid structure and configured to receive at least two vapor species and form a mixed vapor. The mixing chamber is coupled to the deposition chamber via inlets through the lid member structure. Additionally, the apparatus includes two heater platens disposed side-by-side and supported on the base for respectively supporting and heating two substrate panels of roughly the same geometric shape and surface area as each heater platen. Furthermore, the apparatus includes a lifting structure disposed under the deposition chamber and to lift the two substrate panels to a predetermined position inside the deposition chamber by using a plurality of pins to pass through both the base and each of the two heater platens. Moreover, the apparatus includes a valve stack coupled to the deposition chamber via an exit port located below the two heater platens in a central region of the base member structure. The valve stack communicates the deposition chamber with a pumping module through a vacuum line.

In another embodiment, the deposition chamber has an interior shield structure assembled from a first part attached to cover the sidewalls, a second part curtained around an outer peripheral edge of the two heater platens to cover side regions between the two heater platen and the base member structure, a third part to cover a middle gap between the two heater platens, and a fourth part disposed below the two heater platens and above the base member structure to cover a bottom face of the two heater platens. Moreover, the second part of the interior shield structure includes a plurality of holes for guiding a downstream flow of the mixed vapor over peripheral edges of the two substrate panels to pass through into a space below the fourth part before being removed by the pump module via the exit port.

In an alternative embodiment, the invention provides a system for manufacturing thin film photovoltaic devices on substrate panels using chemical vapor deposition. The system includes a precursor subsystem for producing vapors. The precursor subsystem further includes a first delivery module to supply a first liquid, a second delivery module to supply a second liquid, and a third delivery module to supply a gaseous species. Furthermore, the subsystem includes a bubbler control module including a first bubbler and a second bubbler respectively configured to convert the first liquid to a first vapor and convert the second liquid to a second vapor, and a metering valve for controlling a merge of the gaseous species with the second vapor to form a third vapor. Additionally, the system includes a process subsystem including a mixing chamber and a deposition chamber. The mixing chamber is coupled to the bubbler control module to receive the first vapor and the third vapor and form a vapor precursor.

The deposition chamber includes a lid structure, four sidewalls, a door built in one of the four sidewalls, a base structure, a heater platen supported on the base structure for supporting and heating substrates, and an interior shield to cover the four sidewalls and curtain around outer peripheral side regions between the heater platen and the base member structure. The lid structure is coupled to the mixing chamber and configured to deliver the mixed precursor vapor downward into the deposition chamber over the one or more shaped substrates therein. The heater platen is configured to allow a plurality of lift pins to pass through the heating plate and lift the shaped substrates. The interior shield structure has gas flow channels around outer peripheral side regions between the heater platen and the base member structure. The system also includes a valve stack module coupled to the deposition chamber via an exit port located below the heater platen in a central region of the base member structure. The valve stack module includes a pipeline. Furthermore, the system includes a pump module connected to the pipeline. In a specific embodiment, the interior shield structure further includes an insulating plate disposed to cover a bottom face of the heater platen and form a cavity connected to the exit port in the base member structure, thereby causing a downstream flow of the mixed precursor vapor to pass through the plurality of gas flow channels into the cavity before being pumped out via the exit port.

In another alternative embodiment, the present invention provides a method of using vapor deposition for the manufacture of thin film photovoltaic devices on substrate panels. The method includes providing a deposition chamber coupled to a mixing chamber for performing vapor deposition. The deposition chamber includes an upper lid member coupled to the mixing chamber, a lower base member connected with the upper lid member by a number of side members, a heater platen disposed below the upper lid member and configured to have its peripheral edges supported by a frame structure on the lower base member. The mixing chamber is configured to form a mixed precursor vapor. The plurality of feedthrough structures are respectively fed with a plurality of lifting pins configured to move vertically from a low position below the heater platen up to a high position above the heater platen. Additionally, the method includes disposing one or more substrate panels having a form factor as large as 165×65 cm firstly on top of the plurality of lifting pins at the high position then respectively on one or more surface regions of the heater platen as the plurality of lifting pins is lowered to the low position. The heater platen includes one or more embedded pipes respectively laid out under the one or more surface regions and supplied with a fluid from one or more heat sources for heating the one or more substrate panels to a predetermined temperature range substantially uniformly over entire substrate panel. The method further includes configuring the upper lid chamber with a shower-head distributer for releasing the mixed precursor vapor in a steady downward flow over the one or more substrate panels. The mixed precursor vapor partially is transformed to a solid film deposited on the one or more substrate panels and partially forms a down-stream flow flowing over the peripheral edges of the heater platen. Furthermore, the method includes disposing a removable shield structure inside the deposition chamber. The removable shield structure includes at least a first part to cover all the number of side members, a second part to cover a bottom face of the heater platen, and a third part to cover outer side regions of the heater platen above the lower base member. The third part includes a number of holes for at least partially guiding the downstream flow to pass into a space between the second part and the lower base member. Moreover, the method includes coupling a pump module to the deposition chamber via an exit port in a central region of the lower base member to remove at least partially the downstream flow in the space below the heater platen and maintain a predetermined pressure range in the deposition chamber.

In still another alternative embodiment, the present invention provides an apparatus for fabricating thin film photovoltaic devices. The apparatus includes a deposition chamber having a top member and a base member connected by a plurality of side walls. At least one of the plurality of side walls has a door structure configured to load in/out a pair of substrates side-by-side in the deposition chamber. In a specific embodiment, each substrate has a rectangular shape with a first width and first length. Additionally, the apparatus includes two heater platens disposed in the deposition chamber in a side-by-side configuration with a middle gap. Each of the two heater platens has a second width, a second length, and a top surface configured to form an intimate contact with a bottom face of one of the pair of substrates and to supply thermal energy to the substrate in a vapor deposition. The second width and the second length are respectively made smaller than the first width and the first length by a substantially small value so that the top surface of the heater platen including the perimeter edge is substantially covered by the substrate to prevent formation of any edge lip due to coating buildup from the vapor deposition. Moreover, the apparatus includes a shield structure including a stripe-shaped sheet structure and a surrounding skirt structure for substantially preventing the heater platen from coating by the vapor deposition. The stripe-shaped sheet structure is inserted above the middle gap and the surrounding skirt structure is disposed to at least cover substantially all outer peripheral regions of the side-by-side configuration of the two heater platens.

In yet still another alternative embodiment, a method of applying a vapor deposition apparatus for the manufacture of thin film photovoltaic devices on substrate panels. The method includes providing a deposition chamber coupled to a mixing chamber configured to supply a mixed precursor vapor for performing vapor deposition. The deposition chamber includes a top member and a base member connected by a plurality of side walls. At least one of the plurality of side walls has a door structure. The method further includes disposing two heater platens in the deposition chamber in a side-by-side configuration with a middle gap. Each of the two heater platens has patterned heating elements embedded within a plate structure in a second width and a second length respectively configured to be smaller than the first width and the first length by a substantially small value. The heater platen is supported by a plurality of feedthrough structures connected to the base member. Additionally, the method includes loading in/out a pair of substrates side-by-side in the deposition chamber. Each substrate has a rectangular shape with a first width and first length and is supported by a plurality of lifting pins fed through the plurality of feedthrough structures and holes in the heater platen up to a distance above the heater platen. The method further includes lowering the plurality of lifting pins to rest the substrate on a top surface of the heater platen to form an intimate contact between the top surface of the heater platen and the bottom face of the substrate. Each substrate has its peripheral edge substantially extended from each side over a peripheral edge of the heater platen. Furthermore, the method includes using the patterned heating elements to supply thermal energy via the intimate contact to the substrate substantially uniformly. The method further includes distributing the mixed precursor vapor in a steady downward flow over the pair of substrates. The mixed precursor vapor partially being transformed by the thermal energy to a solid film deposited on the pair of substrates and partially forming a downstream flow flowing over the peripheral edges of the pair of substrates without causing any coating buildup on the top surface of the heater platen. Moreover, the method includes disposing a removable shield structure inside the deposition chamber. The removable shield structure includes at least a first part to cover the plurality of side walls, a second part to cover a bottom region of the two heater platens, a third part to cover all outer peripheral side regions of the two heater platens in the side-by-side configuration, and a fourth part to cover the middle gap. The third part includes a number of through-holes for guiding the downstream flow to pass into a space between the second part and the base member. Further, the method includes applying a pump module coupled to the space via an exit port in the base member to remove at least partially the downstream flow and maintain a predetermined pressure range within the deposition chamber.

It is to be appreciated that the present invention provides numerous benefits over conventional techniques. Among other things, the systems and processes of the present invention are compatible but scaled from conventional systems, which allow cost effective implementation of conventional chemical vapor deposition into applications for depositing thin films substantially uniformly on large surface area of glass substrates with various dimensions up to 165 cm. In various embodiments, the apparatus and structures associated with the chemical liquid delivery, doping gas delivery, and vapor generation, vapor mixing to form precursor, precursor vapor delivery, temperature control for both precursor and substrate, and the large sized substrate handling with structure integrity have been disclosed to provide various advantages over the conventional techniques. In one or more embodiments, the precursor vapor delivery is implemented in a lid member configured to distribute the vapor substantially uniform and steady in a downward flow over the substrate surface. The deposition chamber is added an interior shield structure configured to cover almost all interior surfaces except a number of channels in a frame structure around all outer side regions of the heater platens above a base member. The channels guide the downward-flow vapor that flows laterally across the surface of the substrates and over the outer side regions. The downstream flow further is guided to pass through the shield structure towards an exit port built below the heater platens in a central region of the base member structure, where the exit port is coupled to a pump module via a valve stack to remove the vapor residue. This flow pattern substantially enhances the uniformity of the deposited film on the substrates with large form factor of 165×65 cm or the like. In one or more alternative embodiments, the heater platen disposed in the deposition chamber is configured to have a form factor just smaller than the form factor of the substrate so that the substrate including its peripheral edge substantially covers a top surface of the heater platen, preventing formation of any edge lip due to coating buildup from reaction of the precursor vapor. This avoids a degradation of an intimate contact formed between the top surface of the heater platen and bottom face of the substrate, thereby ensuring good and uniform thermal conduction from the heater platen to the substrate. For example, high quality and low cost large scale manufacture of thin film photovoltaic panels directly on extra large glass substrates are achieved with overall efficiency of 11% up to 14% and higher. There are other benefits as well.

DETAILED DESCRIPTION OF THE INVENTION

Figure 1:
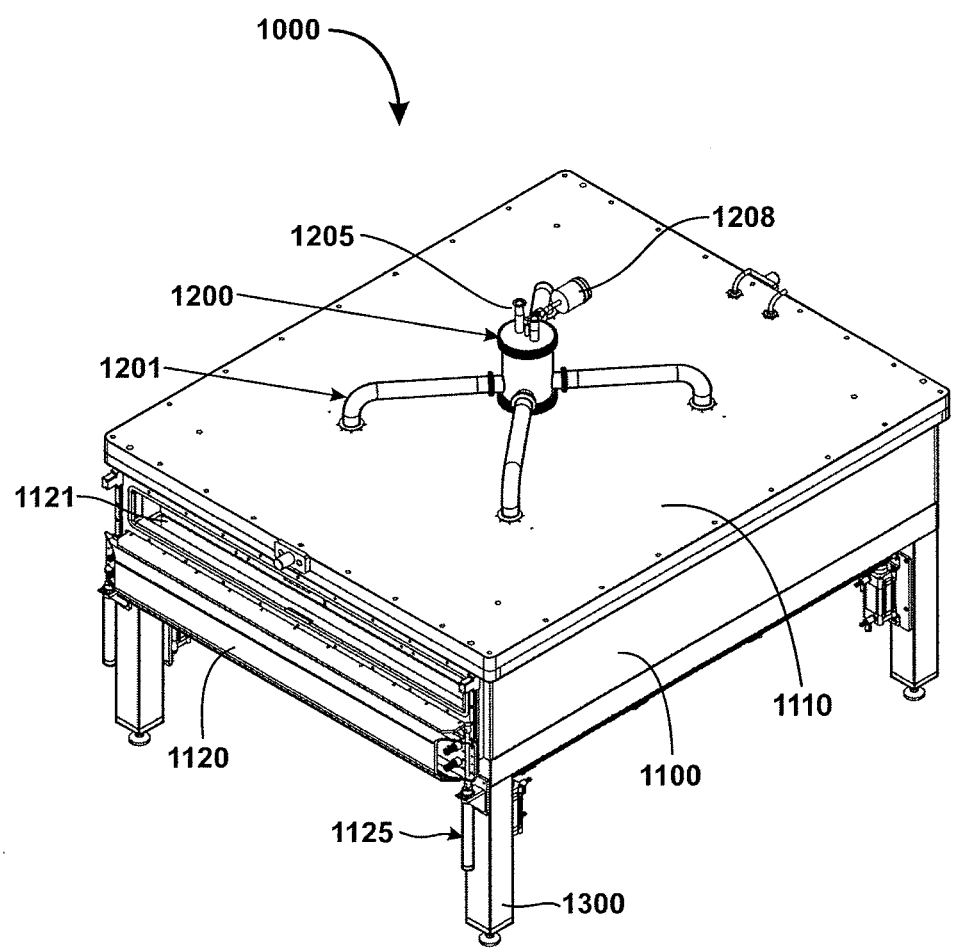
FIG. 1 is a perspective view of a metal-organic chemical vapor deposition process chamber according to an embodiment of the present invention.

FIG. 1 is a perspective view of a metal-organic chemical vapor deposition process chamber according to an embodiment of the present invention. As shown, a process chamber 1000 is provided for fabricating thin film photovoltaic devices on substrate panel using chemical vapor deposition technique, although it can be applied for many other devices on substrate panels with large form factors. The process chamber 1000 includes a deposition chamber 1100 and a mixing chamber 1200. The mixing chamber 1200 is configured to mix several gases to form a mixed gas or vapor material required for performing vapor deposition in the deposition chamber 1100. The mixing chamber 1200 is disposed above the deposition chamber 1100, coupling each other via several pipes 1201. The deposition chamber 1100 has a substantially rectangular shape and is supported at its four corners by a support member 1300. The chamber is designed to have a sufficiently large lateral dimension capable of holding one or more large substrates. More detail interior structure of the deposition chamber 1100 will be described in later sections. In an embodiment, the mixing chamber 1200 includes two or more gas inlets 1205 for receiving predetermined gas or vapor chemicals and forming a mixed vapor material therein. A gauge device 1208 is attached with the mixing chamber 1200 to monitor the pressure of the mixed vapor material, which is to be delivered to the deposition chamber 1100 via several outlet pipes 1201. In a specific embodiment, there are four such outlet pipes 1201 coupled between the mixing chamber 1200 and the deposition chamber 1100, which serve as gas inlets for the deposition chamber 1100. Each of the gas inlets 1201 (associated with the deposition chamber) is inserted through a lid member structure 1110 to deliver the mixed vapor material into the deposition chamber 1100 at a predetermined location intended for depositing substantially more uniformly on one or more substrates disposed therein.

In a specific embodiment, the processing chamber is for fabricating thin film photovoltaic devices using chemical vapor deposition technique, where the thin film photovoltaic devices are formed on large glass substrate panels. The deposition chamber 1100 is made of welded aluminum frames having four sidewalls or side member structures. At least one sidewall is configured to a vacuum flanged door 1120. The door 1120 can be controlled by one or more mechanical actuators 1125. In an embodiment, the mechanical actuators

1125 are airflow actuators. By adjusting flow rates of high-pressured air, the actuators 1125 are capable to let the door 1120 slide up and down to close or open the door. In an open position, door opening 1121 is revealed with a long length and a narrow width. In a close position, the door sealed the door opening to keep the chamber in vacuum condition. When the door 1120 is opened, substrate panels can be loaded/unloaded in/out of the deposition chamber 1110. Therefore, the length of the door opening 1121 is at least wider than the combined width of one or more substrates. In an implementation, a pair of glass substrate panels having a rectangular form factor of 65 cm×165 cm can be loaded in a side by side configuration into the deposition chamber 1100 through the door opening 1121.

Figure 2:
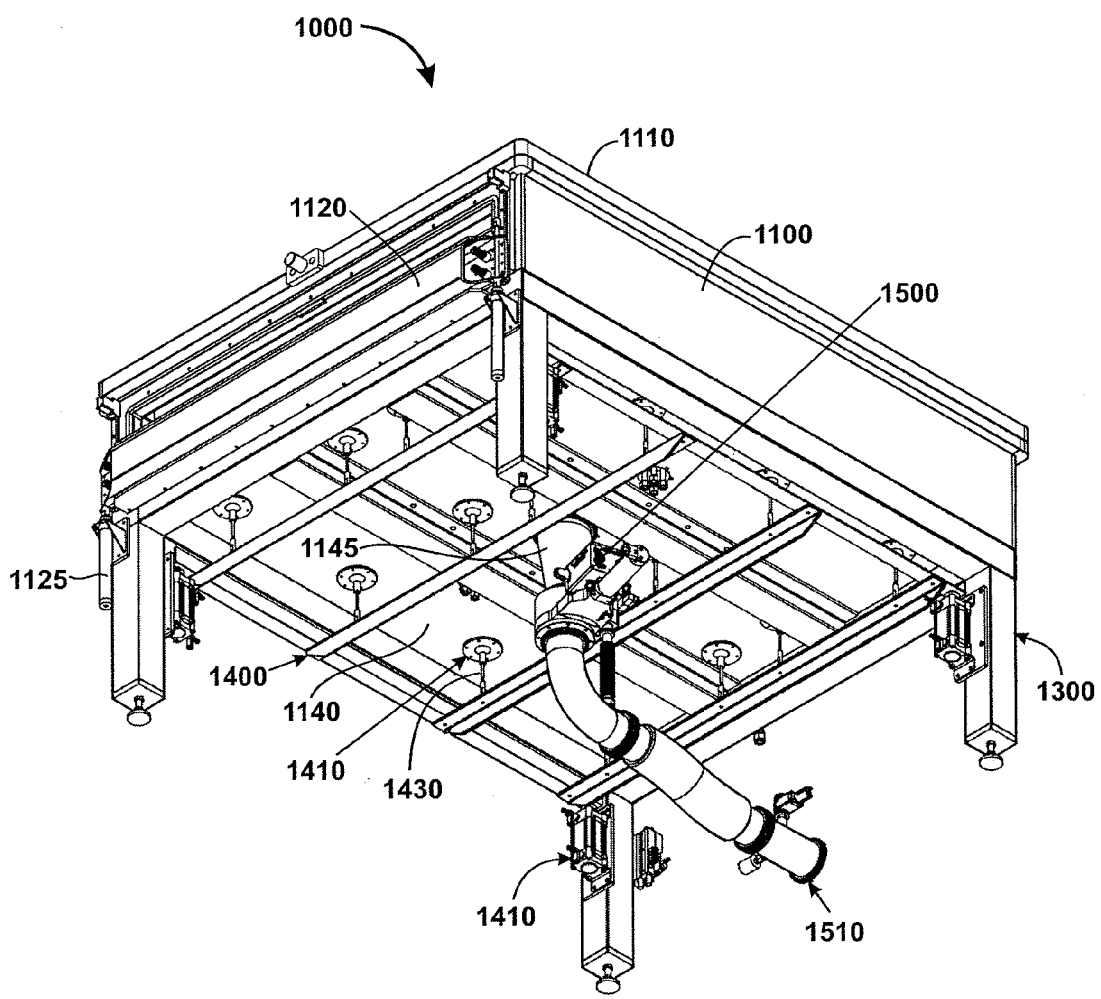
FIG. 2 is another perspective view of the metal-organic chemical vapor deposition process chamber according to an embodiment of the present invention.

FIG. 2 is another perspective view of the metal-organic chemical vapor deposition process chamber according to an embodiment of the present invention. As shown, the underside of a base member structure 1140 of the process chamber 1000 is illustrated. Additionally, a lifting structure 1400 is directly coupled to the base member structure 1140 via a plurality of lift pins 1430. Each of the lift pins 1430 has its one end being attached to a member of the lifting structure and aligned to feed into a feedthrough 1420. The feedthrough 1420 is built with a vacuum sealed flange structure through the base member structure 1140 allowing the lift pin 1430 to completely penetrate through the base member structure 1140 into the vacuum chamber 1100. The lifting structure 1400 is lifted or suspended by pressured airflows from several actuators 1410. By separately and cohesively adjusting the airflow speed of each of four actuators 1410 attached with the four support members 1300, the whole lifting structure 1400 can be lowered or lifted up vertically. Accordingly, all lift pins 1430 are moved down or up in the feedthroughs 1420. Specifically, these lift pins 1430 can be raised up such that their open ends reach the bottom face of the loaded substrate (not visible here) and further lift the substrate inside the chamber 1100 up to a certain height. Because of the apparatus is designed to handle large sized substrate panel, multiple numbers of lift pins 1430 are used at several proper locations to provide secured lifting. In an example, eight lift pins 1430 are used for lifting one substrate in rectangular shape having a form factor of 65 cm×165 cm or greater size. More detail descriptions about supporting, lifting, and loading/unloading substrate panels can be found in sections below.

Referring to FIG. 2, the process chamber 1000 also includes a valve stack module 1500 disposed under the base member structure 1140. The valve stack module 1500 comprises multiple monitoring devices disposed via an exit port 1145 built in the base member structure for connecting a interior space of the deposition chamber 1100 to a pumping module (not shown). One end port of the valve stack module 1500 connects to the deposition chamber 1100 directly via a center flange fitted with the exit port 1145 at the base member structure 1140. At the same time, the other end port of the valve stack module 1500 is hooked with a vacuum foreline 1510 connecting to a pumping module (not shown). The valve stack module 1500 provides multi-stage pumping regulation, pressure control, leak checking and other functions.

Figure 3:
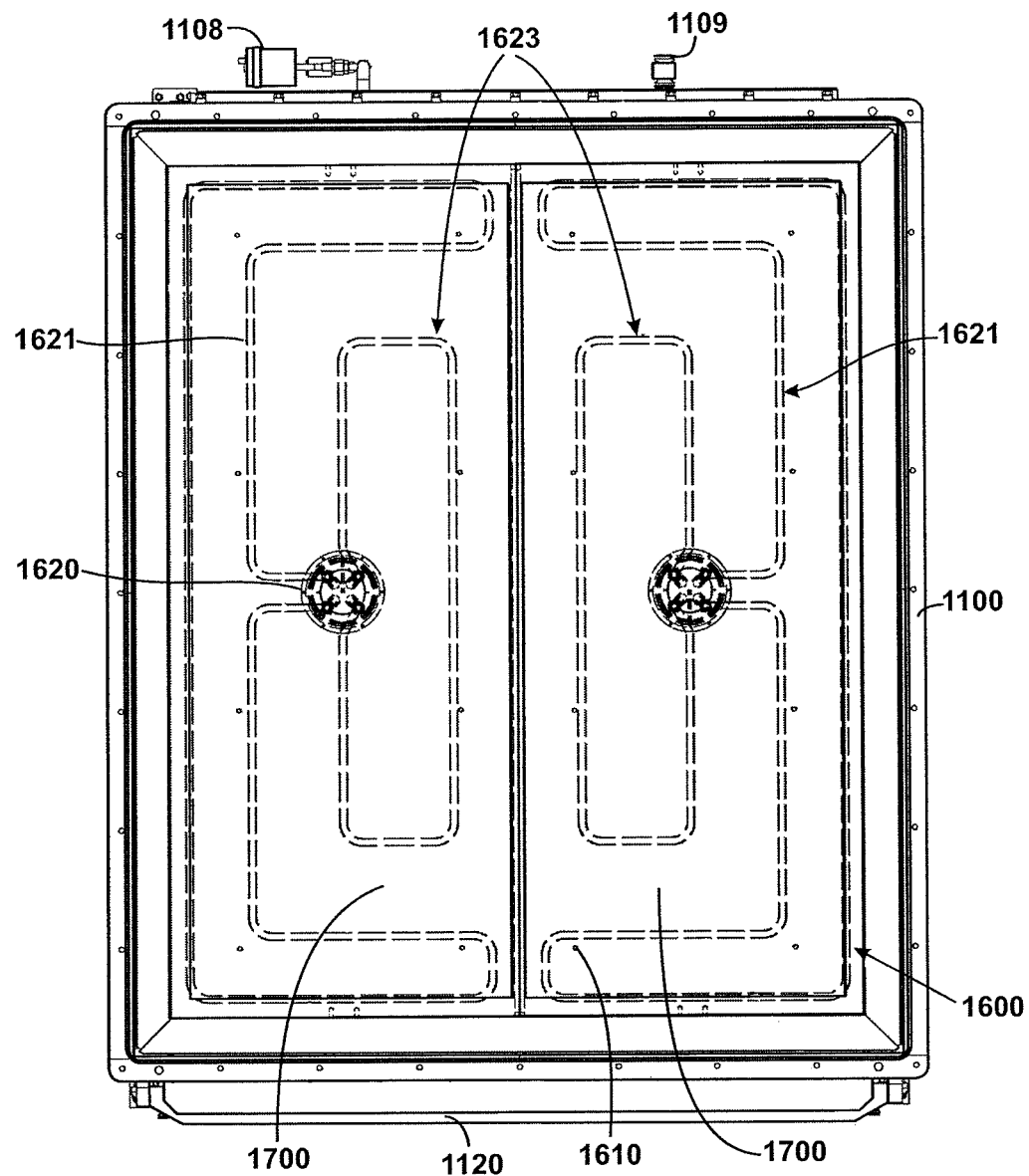
FIG. 3 is a top view of a substrate support plate disposed inside a deposition chamber according to an embodiment of the present invention.

FIG. 3 is a top view of a substrate support plate disposed inside a deposition chamber according to an embodiment of the present invention. In an embodiment, the deposition chamber is designed for loading two or more rectangular shaped substrate panels. As shown, the deposition chamber 1100 includes one or more platens 1600 coupled to its base member structure 1140 for respectively supporting the shaped substrate panels. In a specific embodiment, the one or more plates 1600 are also heater platens for heating any substrate panels supported thereon. In an implementation, two heater platens 1600 in rectangular shape are disposed side-by-side (left-right in FIG. 3) and configured to respectively support two rectangular shaped substrate panels 1700. For example, each of the two substrate panels has a form factor of 165 cm×65 cm or greater. In an embodiment, each of the heater platens 1600 includes one or more heating elements for directly heating the substrate by conduction. The heating elements are embedded in the heater platen 1600, including a first heating pipe 1621 and a second heating pipe 1623 for each of the heater platens 1600. Both heating pipes 1621 and 1623 can be filled with a running liquid, e.g., silicon oil, to transfer thermal energy from a heat exchanger (not shown) to the heater platens 1600 and subsequently to the substrates themselves. In a specific embodiment, the first heating pipe 1621 runs its flow path mainly around an outer boundary regions of the heater platens 1600 while the second heating pipe 1623 runs its flow path substantially around the middle portion. When the two heater platens are disposed side by side, the corresponding first heating pipe 1621 and the second heating pipe 1623 are in a symmetric configuration across their boundary. In fact, the layout configuration of both heating pipes 1621 and 1623 embedded in each heater platen is designed based on the above symmetric two-plate position to provide substantially uniform heating to the respective substrate loaded on each heater platen. The running oil is independently supplied from the heat exchanger into the flow paths of the pipes 1621 and 1623 through a flow structure 1620 including an inlet and an outlet for each of the pipes 1621 and 1623. As shown in FIG. 3, the flow structure 1620 is located near a middle region of each of the heater platens 1600. With both heating pipes 1621 and 1623 properly distributed in respect layout configuration associated with each of the two heater platens 1600, two substrate panels 1700 loaded side-by-side on top of the corresponding two heater platens can be heated via thermal conduction and maintained with a substantially uniform temperature distribution across entire surface areas of the two substrate panels.

Also shown in FIG. 3, each of the two heater platens 1600 includes several through-holes 1610. These through-holes 1610 are aligned to let the corresponding lift pins 1430 to penetrate. In fact, it is intended to use these lift pins 1430 to release the loaded substrate 1700 from the heater platens 1600 and further lift the substrate up to a high position above a top face of the heater platens 1600 so that the substrate can be picked up by a loader arm. In an embodiment, for each heater platen 1600 there are eight such pin holes 1610 allowing eight lift pins 1430 to pass through respectively. FIG. 3 also shows a side door structure 1120 coupled to one sidewall of the deposition chamber 1100. In a specific embodiment, through this side door structure 1120 two rectangular substrate panels 1700 can be loaded in and out. Each of the two substrate panels 1700 firstly sit on the eight lift pins 1430, then rests directly on the top face of the heater platen 1600 as the lift pins are moved to a low position below the heater platen. On the opposite sidewall, a pressure gauge device 1108 and a leak check device 1109 are respectively coupled to the deposition chamber 1100.

Figure 4:
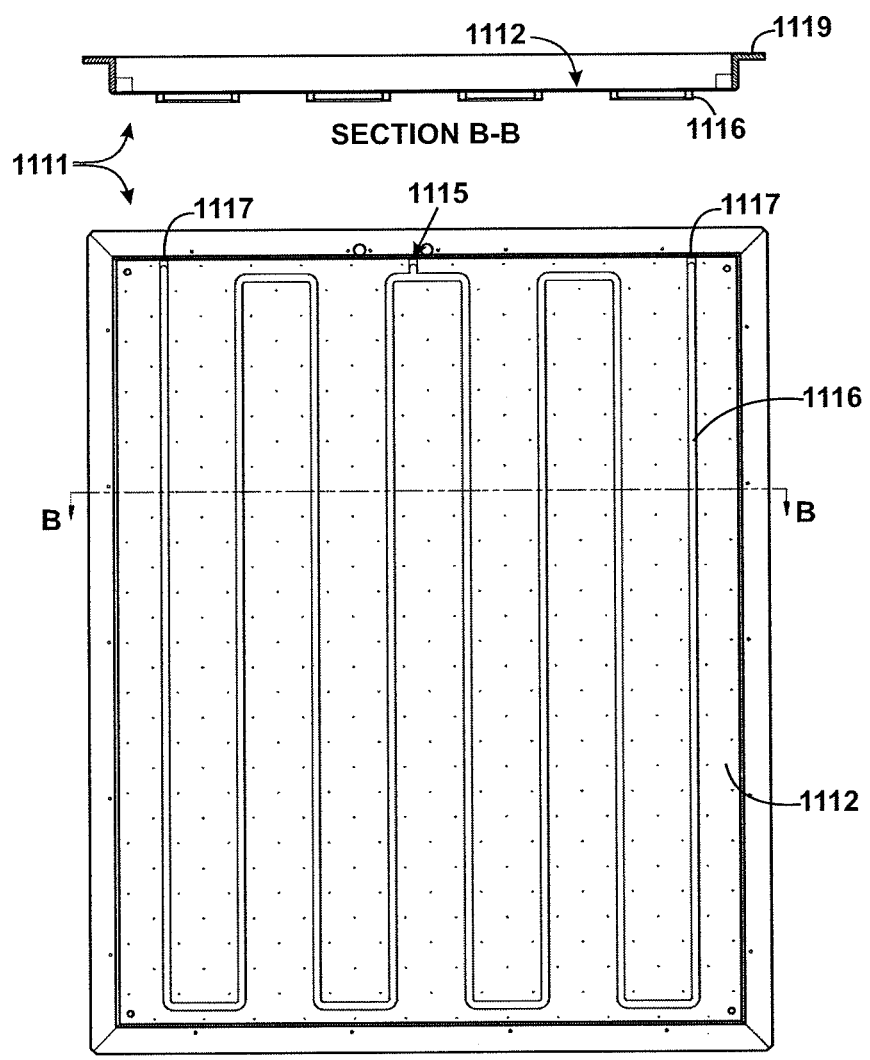
FIG. 4 is a bottom view and a section view (B-B) of a diffuser structure associated with a lid structure according to an embodiment of the present invention.

FIG. 4 is a bottom view and a section view (B-B) of a diffuser structure associated with a lid member structure according to an embodiment of the present invention. As shown, this diffuser structure 1111 has a shallow U-shaped cross section including a diffuser plate 1112 at the bottom and an edge support frame 1119 at its peripheral. When the diffuser structure 1111 is attached to the lid member structure (1110 shown in FIG. 1) it forms a cavity between an undersurface of the lid member structure 1110 and an inner face of the diffuser plate 1112. Gas or vapor material coming from the mixing chamber 1200 can stay within the cavity before being diffused further down to the deposition chamber 1100. The diffuser plate 1112 includes a thickness of about a quarter inches and a plurality of showerhead holes therein, similar like a showerhead, for distributing the mixed vapor material uniformly downward. In order to control the temperature of the mixed vapor material during passing through the plurality of showerhead holes, a cooling channel 1116 is attached to the face of the diffuser plate 1112 and running back and forth to cool the diffuser plate 1112 substantially uniformly. In a specific embodiment, the cooling channel 1116 uses water running through an inlet 1115 and out of two return exits 1117. The running water is controlled by a heat exchanger set outside the process chamber 1000. For maintenance convenience, the cooling channel 1116 is attached at an outer face of the diffuser plate 1112, although they can be attached to an inner face.

Figure 5:
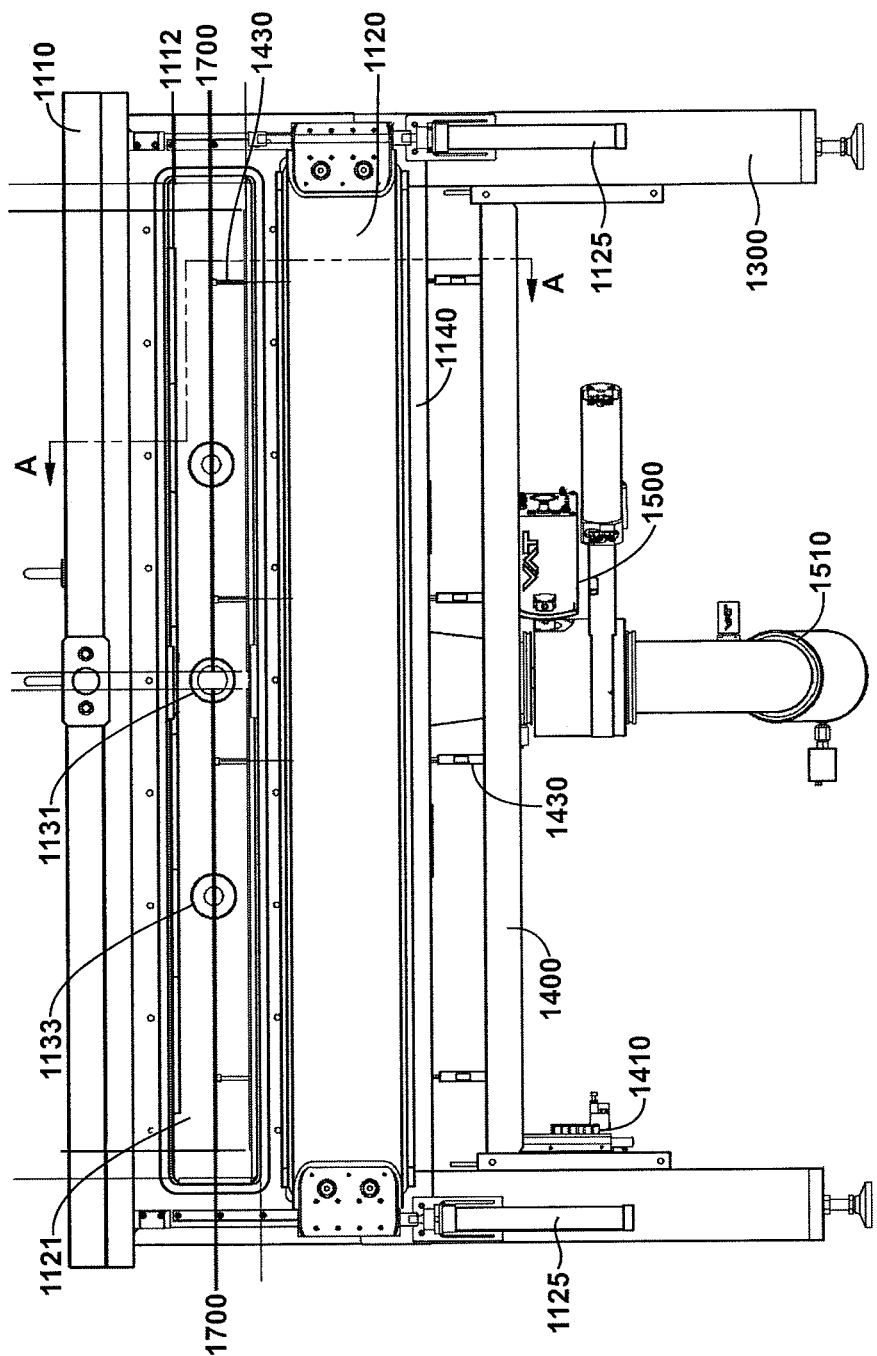
FIG. 5 is a side view of the deposition chamber according to an embodiment of the present invention.

FIG. 5 is a side view of the deposition chamber according to an embodiment of the present invention. Further details of the deposition chamber 1100 shown in FIG. 1 viewed from an angle facing the side door structure 1120 are illustrated. As shown, the side door structure 1120 is in open status, lowered by the door actuators 1125. The door opening 1121 partially reveals inside of the deposition chamber 1100 including the backside wall. The side view also reveals multiple lift pins 1430 each with one end being attached to the lifting structure 1400 and being fed through the substrate heater platen 1600. The other ends of these lift pins 1430 are opened and used to lift the substrate panels 1700 as the pins are raised. As shown, two substrates 1700 are lifted up to a certain height, leaving a spatial clearance under the substrate panels 1700 for a substrate loader (not shown) to slide in and take the substrate panels 1700 out through the door opening 1121. In an implementation, the substrates 1700 can be lifted about 1.5 to 2 inches above the heater platen 1600. Through the door opening 1121, one can also see a view port 1131 and one or more monitor ports 1133 disposed on the back sidewall.

Figure 6:
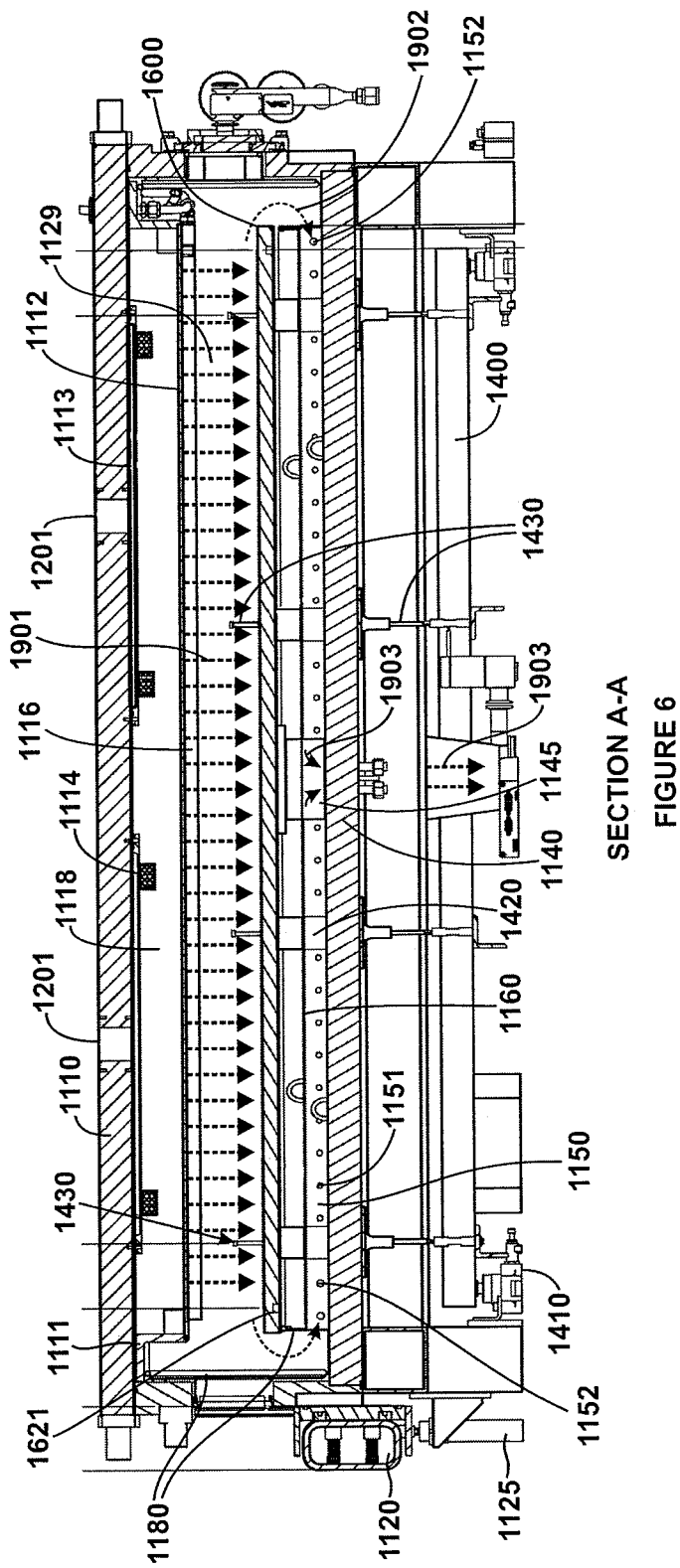
FIG. 6 is a section (A-A) view of the deposition chamber in FIG. 5 according to an embodiment of the present invention.

FIG. 6 is a section (A-A) view of the deposition chamber in FIG. 5 according to an embodiment of the present invention. As shown, a cross-section view of the lid member structure 1110 shows two gas inlets 1201 connected to the deposition chamber 1100 through the lid. The gas inlets 1201 communicate between the mixing chamber 1200 above (see FIG. 1) and the deposition chamber 1100 below. In a specific embodiment, there are four gas inlets 1201 built within the whole lid member structure 1110. The position of each gas inlet 1201 has been selected properly in order to provide substantially uniform vapor deposition over a wide area of the substrate. For example, a gas inlet is substantially above a center position of one half of a substrate panel in its loaded position inside the deposition chamber 1100. Additionally, below the gas inlet 1201, a distributor plate 1113 is attached for enhanced uniform delivery of the mixed vapor material for performing the vapor deposition. The distributor plate 1113 has a disk shape and a thin spatial region between its upper face and the under face of the lid frame to allow the incoming vapor material to spread laterally. The distributor plate 1113 includes four exit-holes disposed near a peripheral edge for further distribute the mixed vapor material downward. In an embodiment, each of the four exit-holes is configured to fit with an additional gas diffusing element 1114. The gas diffusing element 1114 has a sink-filter shape comprising a plurality of tiny holes around its body which extends beyond bottom face of the distributor plate 1113. Through the plurality of tiny holes the incoming gas or vapor is effectively distributed into a cavity 1118 formed by a shallow U-shaped diffuser structure 1111. In a specific embodiment, there are four such distributor plates 1113 respectively disposed under a gas inlet associated with the lid structure 1110. The cavity 1118 can hold a volume of gas between the four distributor plates 1311 and a diffuser plate 1112 positioned a spatial distance below the lid member body 1110 at a bottom of the shallow U-shaped diffuser structure 1111. The diffuser plate 1112 contains a plurality of small showerhead holes (not visible here) spreading the whole area thereof to allow the gas or vapor material further passing downward to deposit onto the substrates 1700 loaded below the diffuser plate.

FIG. 6 further shows additional details of the heater platen 1600 which couples to the base member structure 1140 of the deposition chamber 1100. Several lift pins 1430 are shown in their up position extended into a cavity 1129 above the heater platen 1600 through corresponding holes, provided that no substrate panel is loaded. This "up" position is near the middle of the cavity 1129 provided between the diffuser plate 1112 and the heater platen 1600 in the deposition chamber 1100. In an implementation, the "up" position is about 1.8 inches above the heater platen 1600, providing a spacing between a substrate (if loaded) lifted by these pins and the heater platen 1600. The spacing allows a substrate loader (not shown) to be inserted into the deposition chamber from the door opening 1121 (see FIG. 5) for loading or unloading the substrate.

The lift pins 1430 are fed within corresponding vacuum flanged feedthroughs 1420 built through the base member structure 1140 and the substrate support plate 1600. Each of the lift pins 1430 has one end fixedly coupled to a lifting frame structure 1400. In an embodiment, there are total 16 lift pins properly disposed so that two side-by-side loaded substrate panels with a large form factor of (w) 65 cm×(l) 165 cm can be respectively lifted by 8 lift pins. In the cross-section view shown in FIG. 6 only 4 such lift pins are visible. In another embodiment, the lifting process is realized by raising or lowering the lifting structure 1400 which is controlled by adjusting flow rates of the airflow actuators 1410 mounted to the chamber support member 1300. With proper adjustment of the air flow rates, the lifting structure 1400 can be raised or lowered with a predetermined displacement. Accordingly, the lift pins 1430 are raised a same displacement until the substrate panels (not shown in this figure) are lifted to a certain height within the cavity 1129. The substrate can be lowered till sitting on the heater platen 1600 when the lifting structure 1400 moves an enough distance down to let all the lift pins 1430 below the heater platen 1600.

FIG. 6 also shows how the two heater platens 1600 are coupled to the base member structure 1140 of the deposition chamber 1100. As shown, the vacuum feedthroughs 1420 not only pass through the base member structure 1140 but also have their bodies extended up a distance above the base member structure 1140. The two heater platens 1600 are configured to be directly supported by the bodies of those vacuum feedthroughs 1420, leaving a gap between the heater platens 1600 and the base member structure 1140 to allow a downstream flow. A flat shield member 1160 made by stainless steel can be added in the gap as a thermal insulator plate, respectively forming an upper and a lower spatial region. The poor thermal conductivity of the stainless steel and the upper and lower spatial region above and below the thermal insulator plate 1160 provide sufficient thermal insulation for keeping the two heater platens 1600 within a substantially stable temperature range. Therefore, any substrate panel supported by the heater platens 1600 is substantially under a stable thermal condition. As we described earlier, the heater platens 1600 includes embedded heating pipes 1621 which are also partially visible in this cross-sectional view.

In a specific embodiment, the deposition chamber 1100 further includes a removable shield structure 1180, as shown in FIG. 6, installed inside the deposition chamber for covering interior surfaces of the deposition chamber to avoid unwanted thin-film coating formed during the vapor deposition process. The advantages of using the removable shield structure lie in many aspects including a reduction of re-deposition of particles onto film on the substrate panels from the flakes built in the unwanted coating and reduction of chamber cleaning/maintenance cost. The interior surfaces that are preferred to be covered include all the sidewalls, the bottom face of the heater platens, a strip region in a middle gap between the two heater platens, and a peripheral side region around outer edges of the heater platens.

Figure 6A:
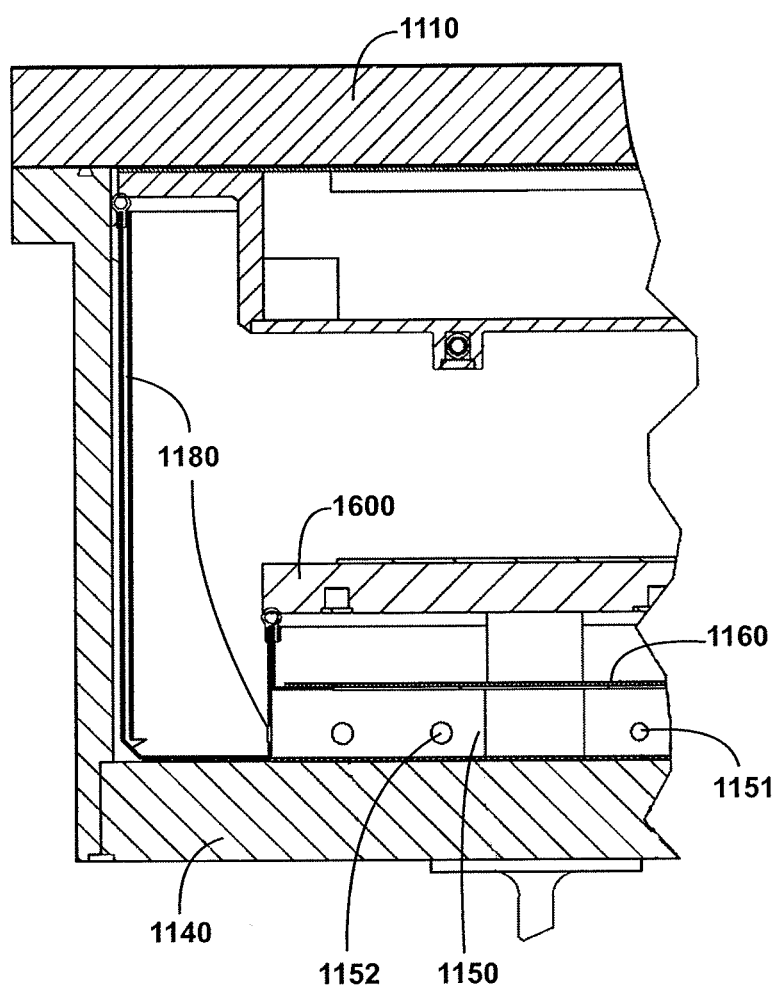
FIG. 6A is a section (A-A) view of an enlarged portion of the deposition chamber in FIG. 6 according to an embodiment of the present invention.

In another specific embodiment, the removable shield structure 1180 for maintenance convenience can be assembled from several parts. For example, a first part can be attached to cover all sidewalls, as seen in FIG. 6. A second part can be curtained around outer peripheral side regions of the heater platens 1600 above the base member structure. A third part (not visible) may be disposed to cover the middle strip region of the two heater platens 1600. A fourth part can be just the flat shield structure 1160 disposed below the two heater platens 1600 and above the base member structure 1140. FIG. 6A further shows a detail look of a corner portion of FIG. 6, illustrating the removable shield structure 1180 installed to the sidewall and side region of the frame structure 1150. As shown, the second part of the removable shield structure has a leveled section used for supporting the fourth part (i.e., the flat insulating plate 1160) of the shield structure. Each assembly piece of the shield structure 1180 can be a sheet metal or thin plate made by stainless steel or aluminum.

In yet another specific embodiment, the second part of the removable shield structure 1180 includes multiple holes 1152 and 1151 located at a lower portion 1150 for connecting the outer side region of the second part shield structure to the lower spatial region between the flat shield member 1160 and the base member structure 1140. As seen in the cross-sectional view of FIG. 6 and FIG. 6A, the holes 1152 and 1151 allow a downstream flow to pass through the lower portion 1150 of the shield structure. In an embodiment, the mixed vapor material supplied from the mixing chamber 1200 is distributed via a plurality of showerhead holes of the distributer plate 1112 as a downward flow 1901 into the cavity 1129 of the deposition chamber 1100 over the loaded substrates on the heater platens 1600. The mixed vapor material partly is transformed into a solid film deposited overlying the substrates (which is heated by the heater platen 1600 to an elevated temperature to induce a reaction among the mixed vapor to form a solid species). Part of the mixed vapor material forms a downstream flow 1902 over the peripheral edge of the heater platens 1600 towards the side regions of second part of the shield structure. The plurality of holes or gas flow channels 1151 and 1152 thus guides the downstream flow 1902 to pass through the lower portion 1150 of shield structure into the lower spatial region between the flat insulation plate 1160 and the base member structure 1140. The lower spatial region is directly linked to the exit port 1145 built in a central region of the base member structure 1140, allowing all the downstream flow 1902 to be sucked as an exit flow 1903 by a pump module (not shown). A valve stack module 1500 (see also FIG. 2) is installed between the exit port 1145 and the pump module to control the exit flow 1903 and help to maintain a substantially steady chamber pressure within a predetermined range for performing the vapor deposition.

The combined structural configuration of the chamber, heater platens, and the removable interior shield structure helps to induce a steady interior flow for the mixed vapor material. After being distributed as a substantially uniform downward flow 1901 from the showerhead distributer 1121, the mixed vapor material reaches to the entire surface regions of the loaded substrate panels substantially uniform and steady during the vapor deposition process. The downstream flow of remaining vapor material is guided over the peripheral edge of the heater platens 1600 before being partially removed out from the exit port 1145. The holes 1152 near a corner region of the lower portion 1150 of the shield structure are made slightly bigger than the holes 1151 located away from the corner region, which is a structural design allowing a substantially balanced downstream flow all around the peripheral side regions towards the exit port 1145. The as-formed steady interior gas flow plays important role to enhance uniformity of the film deposition on the substrate panels having a form factor as large as 165 cm×65 cm or greater. Disposing two 165 cm×65 cm substrate panels in a side-by-side configuration also help to make the total area of the heater platens 1600 to be near a square shape, with a reduced directional non-uniformity.

Figure 7:
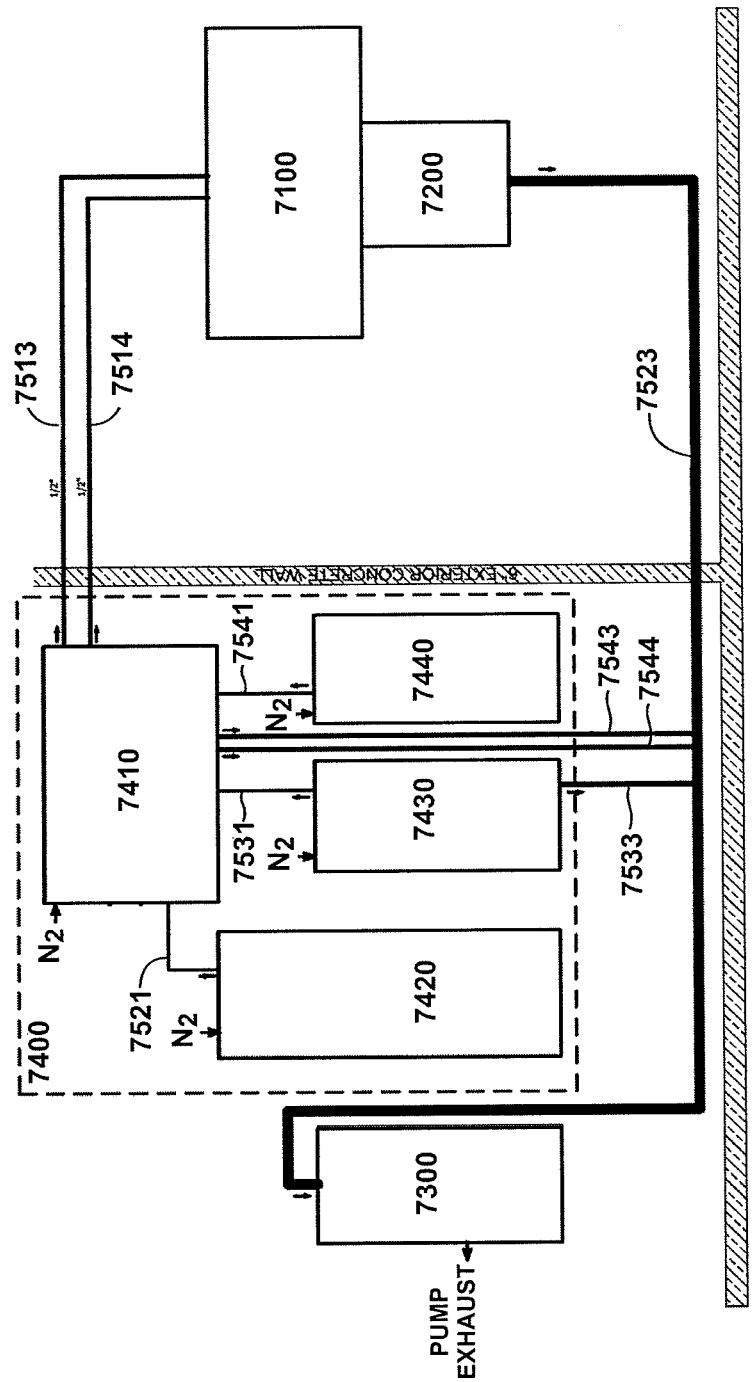
FIG. 7 is a simplified diagram illustrating a system for fabricating thin film photovoltaic devices according to an embodiment of the present invention.

FIG. 7 is a diagram illustrating a system for fabricating thin film photovoltaic devices according to an embodiment of the present invention. As shown, the system 7000 is a metal-organic chemical vapor deposition (MOCVD) system for fabricating one or more thin films for photovoltaic devices on substrate panels with various sizes from 20 cm×20 cm to as large as 65 cm×165 cm or other form factor. The system 7000 includes a MOCVD process module 7100, a valve stack module 7200, a vacuum pump module 7300, and a precursor subsystem 7400. The process module 7100 includes a mixing chamber and a deposition chamber. The mixing chamber is for receiving one or more vapor materials and mixing them to form a mixed vapor precursors. The mixing chamber directly coupled to the deposition chamber to deliver the precursors through a lid structure and deposit onto substrates loaded inside the deposition chamber. The deposition chamber can be maintained in a vacuum condition during the process by using the pump module 7300 connected by a 4-inch vacuum foreline 7523 and mediated by the vacuum valve stack module 7200 for monitor and regulation. The precursor subsystem 7400 includes a bubbler control module 7410, a plurality of delivery modules for supplying liquid materials for preparing the vapor precursors needed for thin film growth in deposition chamber. In a specific embodiment for fabricating a top electrode structure for thin film photovoltaic device based on copper indium diselenide material, a first delivery module 7440 is used for supplying DI water, a second delivery module 7430 is used for supplying diethylzinc (DEZ) liquid, and a third delivery module 7420 is for providing one or more types of doping materials. In particular, a doping material used in an implementation is diborane gas mixed with nitrogen gas.

Referring to FIG. 7, the bubbler control module 7410 is coupled to the process subsystem 7100 via two delivery pipelines 7513 and 7514 respectively for delivering two different vapor material(s). In a specific embodiment, a first vapor material is generated by a bubbler within the module 7410 from DI water supplied by the first delivery module 7440 through a pipeline 7541. The first delivery module 7440 needs a purge gas for inducing the delivery. In an embodiment, the purge gas uses typical inert gas like pure nitrogen. A second vapor material may be generated by a separate bubbler within the module 7410 from a second liquid supplied by the second delivery module 7430 through a pipeline 7531. In an implementation, the second liquid includes Diethylzinc (DEZ) liquid. Similarly, the second delivery module 7430 also connects to a nitrogen gas source for inducing the liquid delivery. In a specific embodiment, the bubbler control module 7410 also includes one or more valves and pipe circuits for merging one or more gaseous material into the second vapor material. As shown, the gaseous material may be directly supplied from a third delivery module 7420 through a pipeline 7521 into the module 7410. In an implementation, the gaseous material is originated from a predetermined dopant gas species mixed with nitrogen gas and is delivered via a pressured nitrogen gas. In addition, the module 7410 has two vent pipelines 7543 and 7544 coupled to the vacuum foreline 7523, respectively for the venting of the two delivery pipelines 7513 and 7514. The second delivery module 7430 also has a vacuum vent line 7533 connected to the vacuum foreline 7523. The bubbler control module 7410 also uses a pressurized nitrogen process gas in the vapor generation and delivery process for the first vapor material and the second vapor material. Furthermore, a fluid pipe with running temperature-controlled fluid can be used to attach with each bubbler in the bubbler control module for maintaining a liquid box within a temperature range between about 15° C. to about 30° C. The hot fluid is supplied from and returned to a remote heat exchanger (not shown).

Figure 8A:
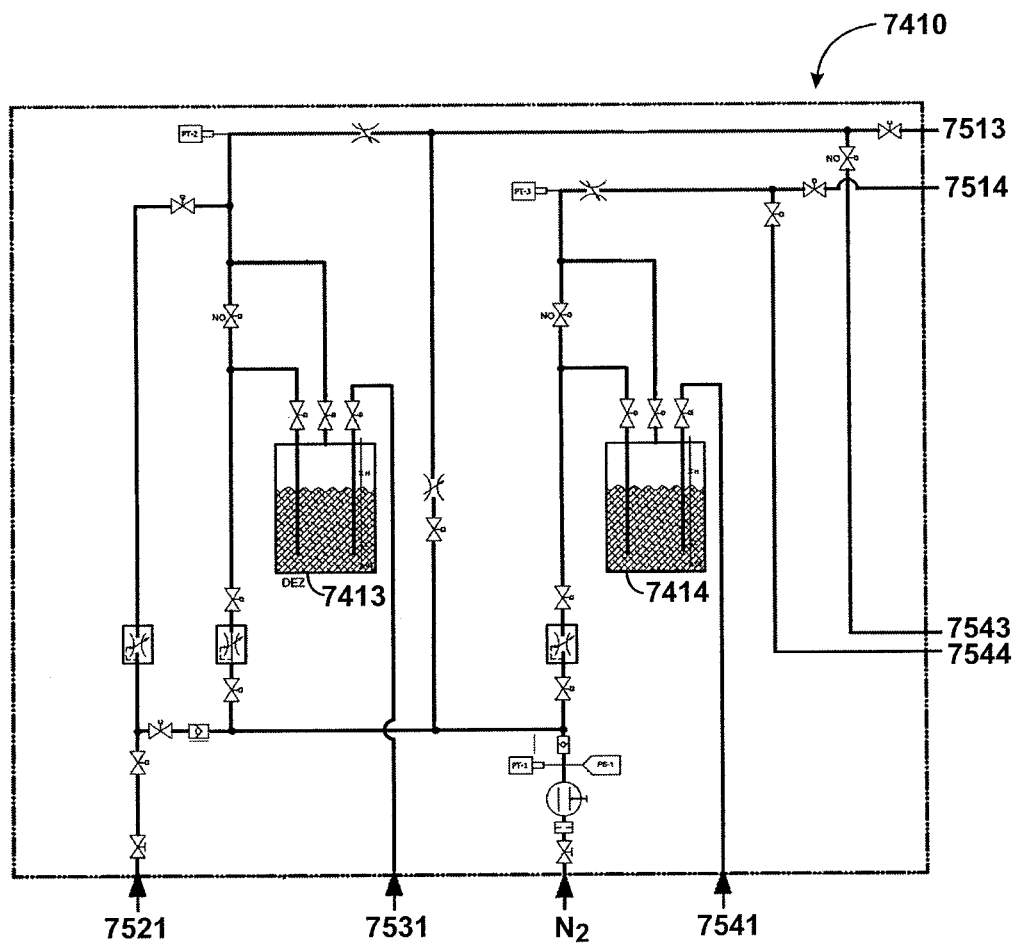
FIG. 8A shows a bubbler control module of the system for generating vapors from liquid chemicals according to an embodiment of the present invention.

FIG. 8A shows a bubbler control module of the system for generating bubbles from liquid chemicals according to an embodiment of the present invention. This diagram is merely an example, which should not limit the scope of the claims herein. As shown in a specific embodiment, the bubbler control module 7410 is a control box containing a water bubbler 7414 and a DEZ liquid bubbler 7413. The box has an approximate dimension of 50 inch (H)×22 inch (W)×16 inch (D) fabricated from steel and exhausted at 150 cfm using a 4-inch diameter duct. The water bubbler 7414 is configured to receive DI water with a dynamic pressure of about 5 psig from a first liquid inlet 7541. The DEZ liquid bubbler 7413 is set up similarly to receive DEZ liquid through a second liquid inlet 7531. A first gas inlet provides nitrogen process gas with 80 psig pressure 10 slm flowrate settings for inducing bubble generation and vapor delivery for both bubblers 7413 and 7414. The nitrogen gas is introduced through a valve and is filtered then regulated by N2 regulator set at 20±1 psig. A check valve is sequentially in the pipeline before sending the nitrogen process gas to split to either the water bubbler or DEZ liquid bubbler. The nitrogen process gas is further adjusted by a metering valve with a flow setting of about 5 slm before being directed (via one or more pneumatic valves) into each bubbler. The N2 process gas or the supplied liquid is fed through a bubbler box top using a ¼ inch bulkhead VCR connection and guided down to the bottom region of the stored liquid in the box. The gas or vapor outlets of the bubblers are fed through the box top using a ½-inch bulkhead VCR connection and connected to vapor delivery pipelines 7514 or 7513. Each bubbler 7413 or 7414 includes a combination of ultrasonic level sensor, continuous level measurement and two discrete high and low points at 75% and 25% full respectively.

Also shown in FIG. 8A, the vapor delivery pipelines 7514 and 7513, as shown, also respectively coupled to two vacuum vent lines 7544 and 7543. All vapor delivery pipeline is kept above 25° C. at all times and shall not exceed 50° C. Additionally, the bubbler control box 7410 includes a second gas inlet 7521 for delivering a gaseous material and controllably merging with the second vapor material generated by the DEZ bubbler. In an implementation, the gaseous material is a mixture of 0.75% diborane and nitrogen gas. A metering valve is employed to set the flow rate to about 2 slm before allowing the gaseous material to merge with the second vapor in the outlet pipeline 7513. Therefore, the actual vapor material outputted via a gas outlet of the bubbler control module into the delivery pipeline 7513 should be a third vapor material containing a mixture of both the second vapor and the gaseous material. In a specific embodiment, the third vapor material comprises at least DEZ vapor, nitrogen gas, and diborane gas.

Figure 8B:
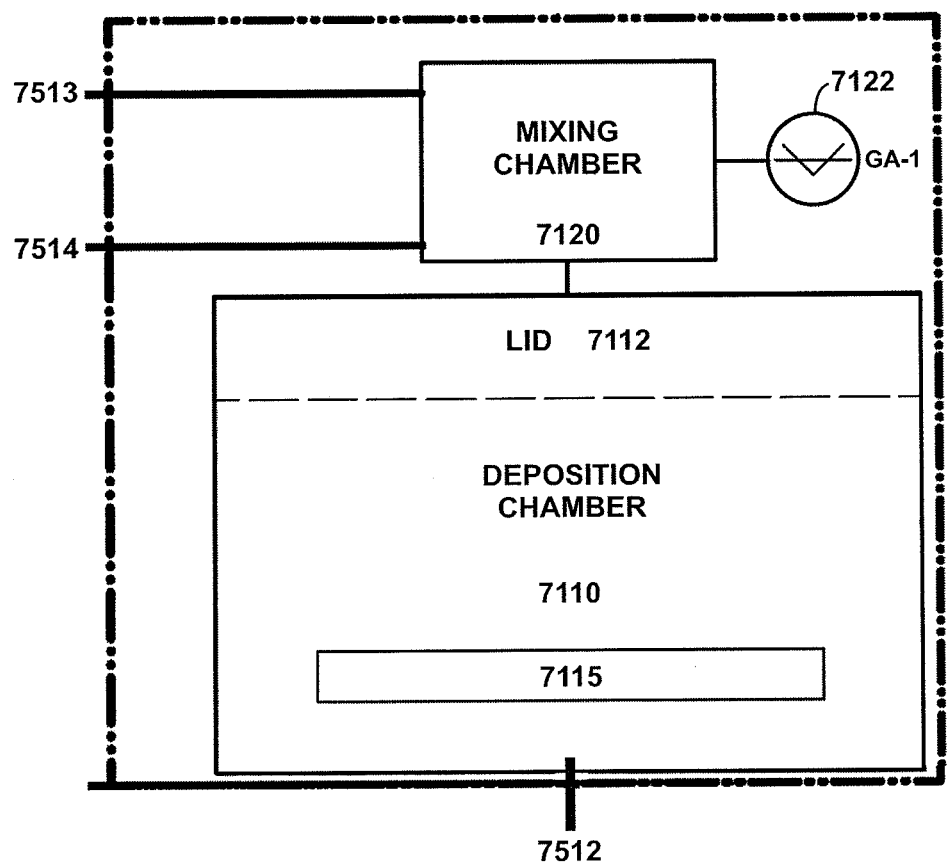
FIG. 8B shows a process module of the system according to an embodiment of the present invention.

FIG. 8B shows a process module of the system according to an embodiment of the present invention. This process module is substantially a simplified version of the apparatus 1000 shown in FIGS. 1 through 6. As shown, the process module 7100 includes a mixing chamber 7120 and a deposition chamber 7110 coupled to the mixing chamber through a lid structure 7112. The mixing chamber 7120 has two gas inlets which are respectively connected to two vapor delivery pipelines 7513 and 7514 (see FIG. 7 and FIG. 8). Within the mixing chamber, all the vapor materials received are mixed to form a mixed vapor precursor intended for processing chemical vapor deposition. The mixing and vapor delivery process is monitored directly by a pressure gauge 7122 connected via a ½ inch VCR connection. The vapor precursors formed in the mixing chamber 7120 then can be distributed downward through the lid structure 7112 into the deposition chamber 7110 to deposit onto one or more substrates 7115. In particular the distribution process via the lid structure is thermally controlled to maintain a desired temperature for the vapor precursor passed by and is configured to substantially uniformly diffuse the vapor precursor throughout all surface area of one or more substrates 7115 with dimensions ranging from 20 cm to 165 cm. The deposition chamber 7110 has a vacuum port 7512 capable of connecting a pump module (not shown).

Figure 8C:
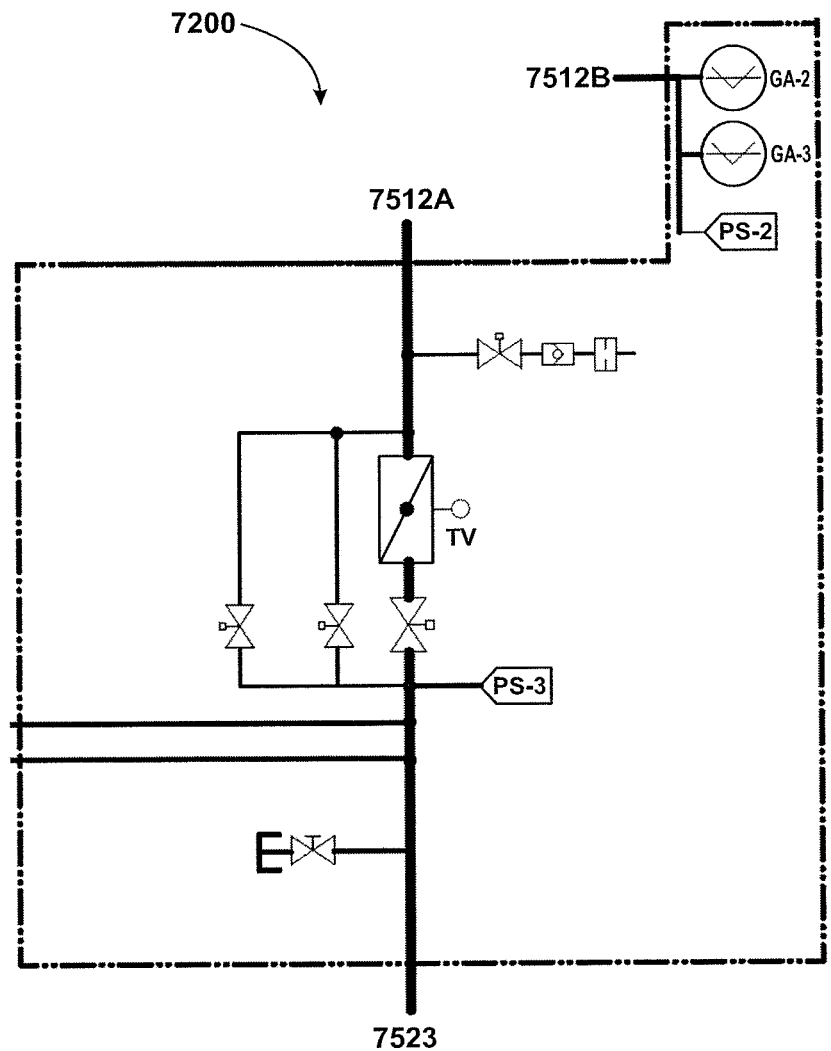
FIG. 8C shows a valve stack module of the system for controlling vacuum condition of the process module of FIG. 8B according to an embodiment of the present invention.

FIG. 8C shows a valve stack module of the system for controlling vacuum condition of the process module of FIG. 8B according to an embodiment of the present invention. This diagram is merely an example, which should not limit the scope of the claims herein. As shown, the valve stack module 7200 includes a monitor port 7512B for connecting one or more pressure gauge or pressure switch to measure and monitor chamber pressure and control a throttle valve. The valve stack module 7200 directly couples to the process module via a vacuum port 7512A which is the same port 7512 shown in FIG. 8B. Additionally, the valve stack module 7200 includes a combination of several mechanical valves including the throttle valve, a rough valve, a medium pump valve, a slow pump valve, and a pressure switch. Further along the vacuum foreline, there is also a leak check port with a manual valve connected between the pressure switch and the vacuum pipeline 7523 for connecting to a pump module.

Figure 9A:
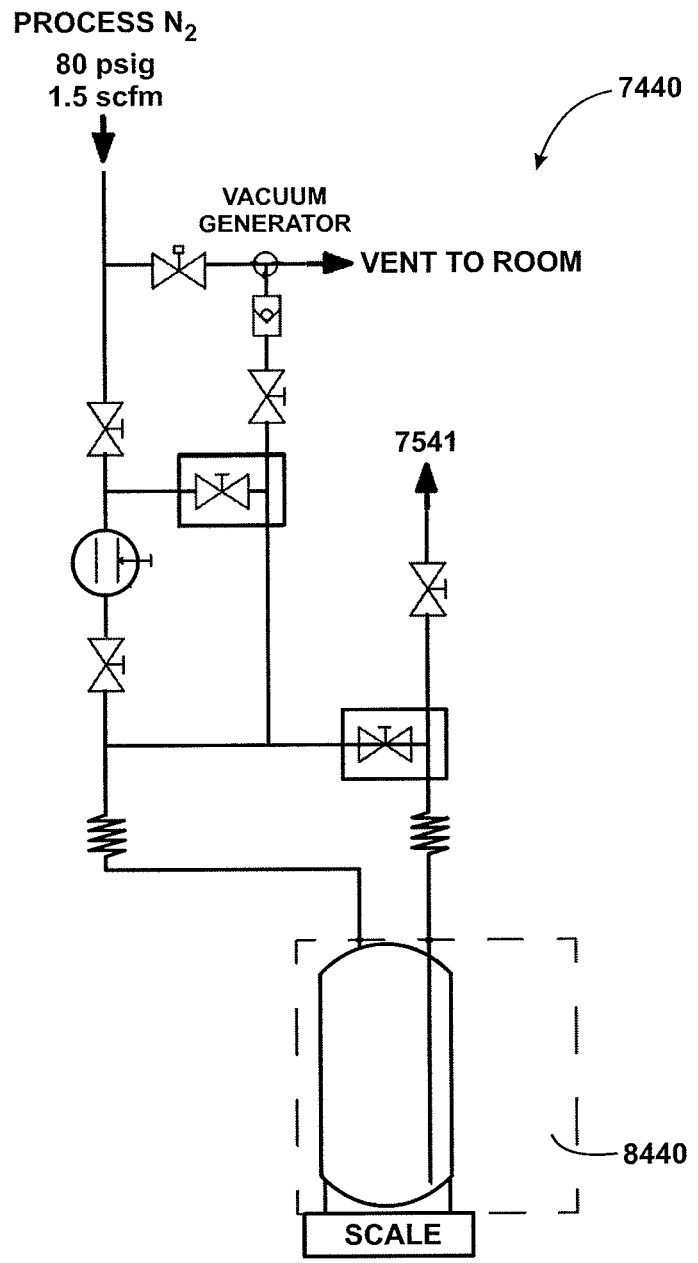
FIG. 9A shows a first delivery module for delivering a first liquid according to an embodiment of the present invention.

FIG. 9A shows a first delivery module for delivering a first liquid according to an embodiment of the present invention. This diagram is merely an example, which should not limit the scope of the claims herein. In a specific embodiment, the first delivery module 7440 is for supplying a first liquid, DI water in an implementation, to the first bubbler 7414. As shown, the module 7440 includes a purge gas inlet to draw nitrogen process gas through a combination of valves and regulators, a water tank 8440 capable of storing at least 5 gal of DI water, an outlet port connected to the first liquid inlet 7541 towards the bubbler control module 7410, and an alternate vent port for venting to room thereof. In an example, the process gas is set to a pressure of 80 psig with a flow rate of about 1.5 scfm. Before it is guided to the water tank, an $N_2$ regulator is added to set and lock the nitrogen process gas pressure at about 5 psig which is also the dynamic pressure for outgoing DI water flow towards the first bubbler.

Figure 9B:
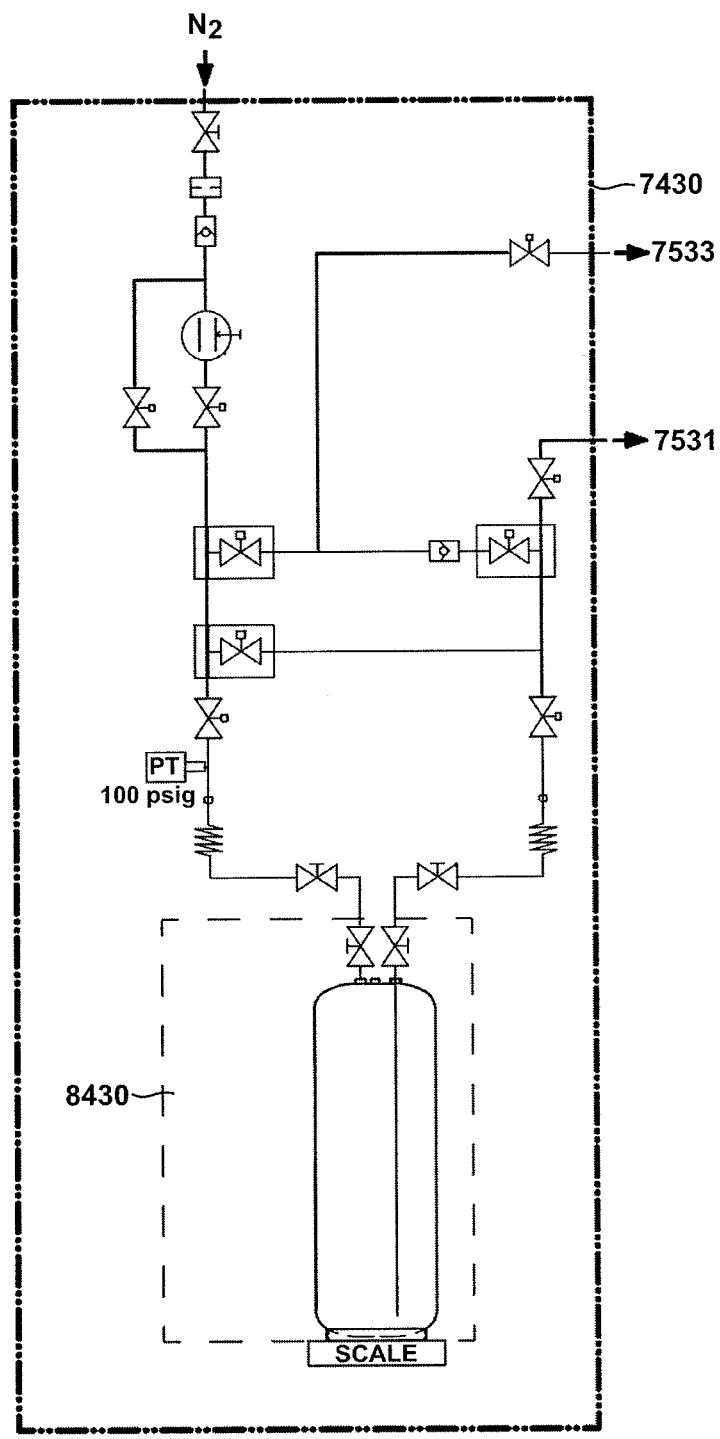
FIG. 9B shows a second delivery module for delivering a second liquid according to an embodiment of the present invention.

FIG. 9B shows a second delivery module for delivering a second liquid according to an embodiment of the present invention. As shown, the second liquid to be delivered is DEZ liquid in a specific implementation for fabricating ZnO film on photovoltaic devices. The module 7430 is a separate box having a dimension of about 70×26×24 inches fabricated by steel, including a DEZ liquid tank, a combination of various valves, regulators, and pressure transducer, a vent port, an outlet for delivering the DEZ liquid, and a gas inlet. The gas inlet connects to a source of 80 psig pressurized nitrogen $N_2$ process gas with a 10 slm flow setting. The $N_2$ process gas is filtered and regulated by an $N_2$ regulator with a flow rate locked at 5 psig before being split and partially guided to help deliver the DEZ liquid. Partially the nitrogen $N_2$ process gas is guided through a pressure transducer set at 100 psig for pushing the DEZ liquid through the outlet to the second liquid inlet 7531 of the bubbler control module 7410. The vent port is connected to the vacuum pipeline 7523 for letting waste liquid vapor or nitrogen being pumped out.

Figure 9C:
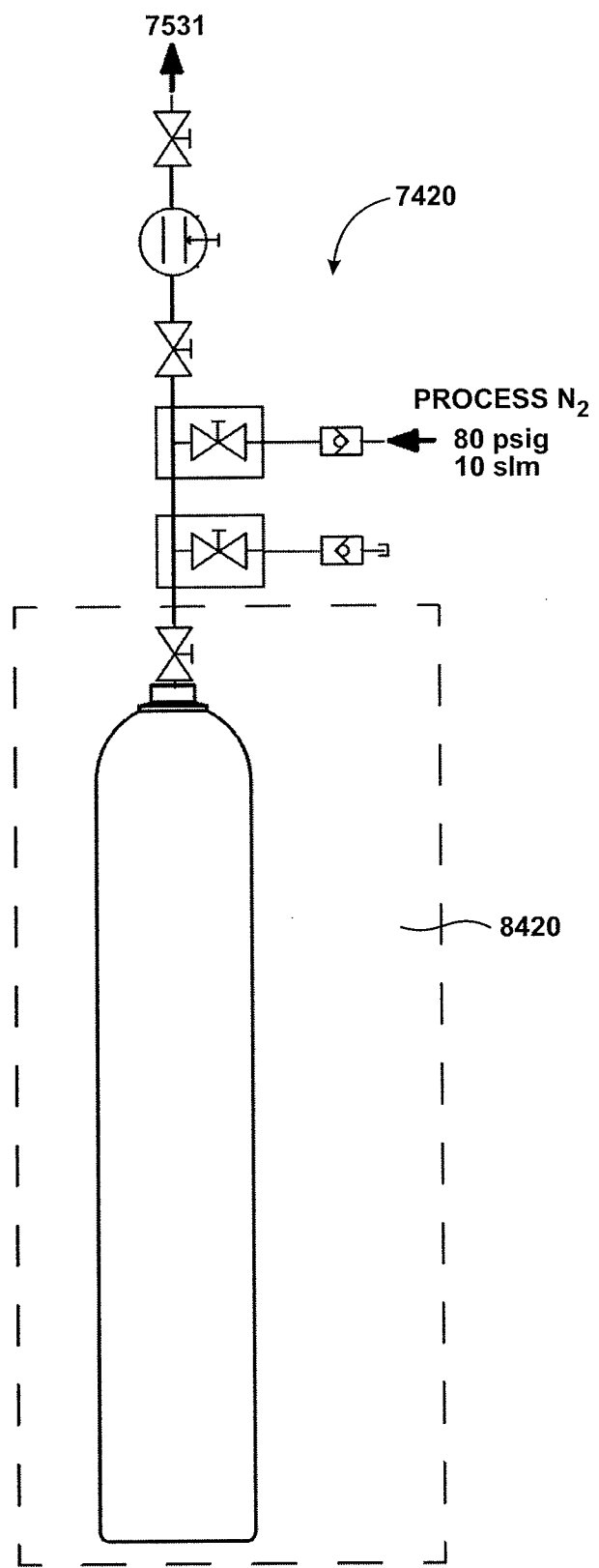
FIG. 9C shows a third delivery module for delivering a gaseous species according to an embodiment of the present invention.

FIG. 9C shows a third delivery module for delivering a gaseous species according to an embodiment of the present invention. This diagram is merely an example, which should not limit the scope of the claims herein. As shown, the module 7420 includes a storage gas bottle and manifold 8420, a gas inlet, and an outlet for delivering a gaseous species to the second gas inlet 7531 of the bubbler control module 7410. The gas inlet is directly connected to a source of 80 psig pressured nitrogen $N_2$ process gas with a 10 slm flow setting. The pressured $N_2$ process gas help to deliver the gas species coming out of the storage gas bottle 8420 and use a regulator to set the outflow rate at 5 psig.

Figure 10:
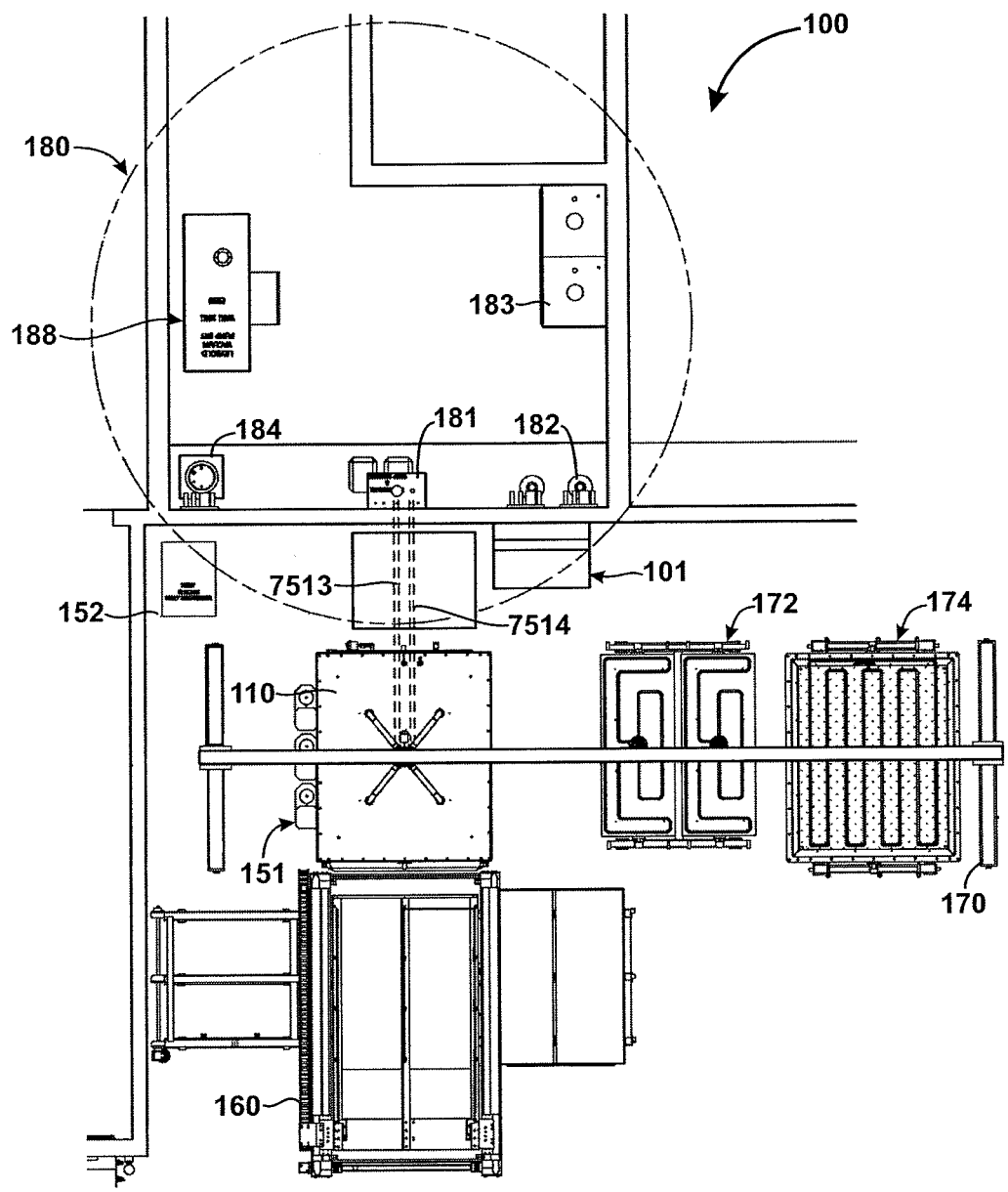
FIG. 10 shows a MOCVD system for manufacturing large scale thin film photovoltaic panels according to an embodiment of the present invention.

FIG. 10 is a top view of a MOCVD system for manufacturing large scale thin film photovoltaic panels according to an embodiment of the present invention. As shown, the system 100 is a metal-organic chemical vapor deposition (MOCVD) system for fabricating conductive oxide films over thin film photovoltaic cells built on large substrate panels. In a specific embodiment, the thin film photovoltaic cell is based on copper indium diselenide thin film semiconductor absorber. To form top electrode film or window layer for completing the photovoltaic devices, this system is capable of depositing films over the substrates having dimensions ranging from 20 cm to 165 cm. In an embodiment, the system 100 is substantially the same as system 7000 shown in FIG. 7. In a specific embodiment, the system 100 includes a MOCVD process module 110 disposed in a room with a dual substrate loader 160 attached to a side having a door access to a deposition chamber. The system 100 also includes a subsystem 180 disposed in a separate room, including a pump module 188 and a vapor delivery control box 181, a water delivery module 184, a DEZ liquid delivery module 183, and a dopant gas supply module 182. The top part visible of the process module 110 reveals a lid of the deposition chamber coupled to four gas inlets from a mixing chamber (disposed over the deposition chamber but the view is partially blocked by an overhead crane structure). The mixing chamber is coupled through a pair of gas pipelines 7513 and 7514 for receiving two vapor materials delivered from the vapor delivery control box 181. The vapor materials are mixed within the mixing chamber to form a vapor precursor ready for delivering into the deposition chamber. One or more high temperature heat exchangers 151 are set to another side of the deposition chamber for providing hot oil running into the heating pipe embedded in the heater platen (not visible here) therein. Over the process module 110, there is a crane structure 170 set for maintenance services of the lid including a vapor diffuser plate or the heater platen and any associated parts. The crane structure 170 is high enough to lift the lid or the heater platen and configured to turn them around for the convenience of cleaning, repairing, and other maintenance works. In an example, FIG. 10 shows a heater platen 172 with dual heaters and a lid 174 attached with a diffuser plate respectively in their maintenance positions set by the crane structure 170.

In a specific embodiment, the system 100 also includes a control console 101 for the whole system and a diffuser heat exchanger 152 remotely disposed for providing temperature control running fluid for the diffuser plate associated with the lid member.

Figure 11:
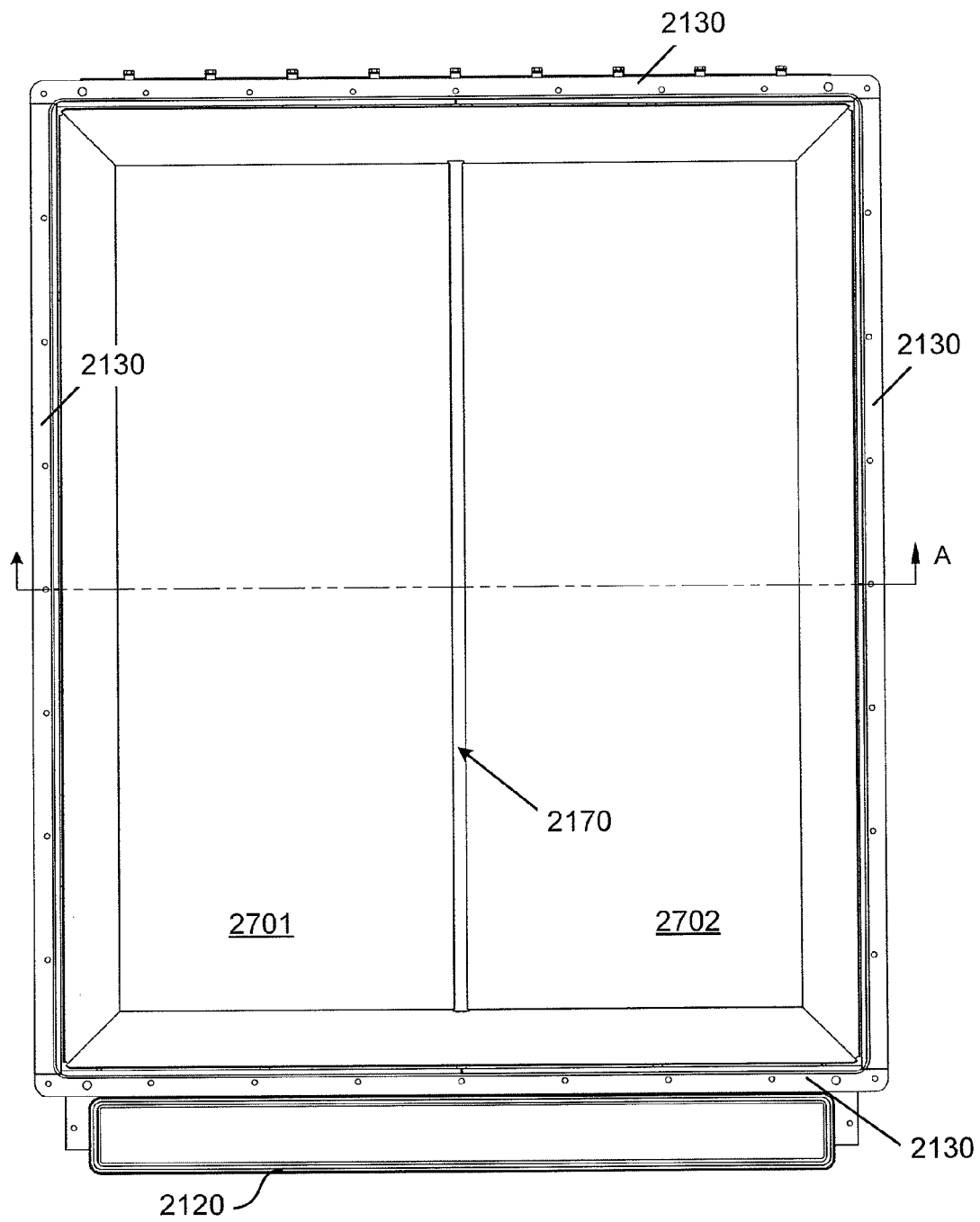
FIG. 11 shows a top view of an apparatus for manufacturing thin film photovoltaic devices according to an alternative embodiment of the present invention.

In an alternative embodiment, the present invention provides an apparatus for performing thin-film vapor deposition onto a pair of substrates with exceptional large form factor. In an example, the apparatus is applied to manufacture a thin-film photovoltaic device on a monolithically integrated glass panel having a form factor of 165 cm in length by 65 cm in width. FIG. 11 shows a top view of the apparatus for manufacturing thin film photovoltaic devices according to an alternative embodiment of the present invention. This diagram is merely an example, which should not limit the scope of the claims herein. As shown, the apparatus includes a deposition chamber that is shown with a top lid member being removed and four side walls 2130 connected each other to provide a rectangular shape. At least one side wall is configured with a door structure 2120, shown as an opened state in FIG. 11. Through the door structure 2120, a pair of substrates 2701 and 2702 is respectively loaded in to the deposition chamber. Provided the shape and size of the deposition chamber, the number of the substrates capable of being loaded in the deposition chamber is associated with their size and shape. Therefore, FIG. 11 shows just a specific configuration that sets the pair of substrates with a rectangular form factor in a side-by-side configuration over two supporting platens disposed inside the deposition chamber.

The deposition chamber as shown in FIG. 11 is substantially the same as the chamber 1000 shown in FIG. 1 and FIG. 2. The substrate supporting platen, which is not directly visible in FIG. 11, is a heater platen 1600 described in earlier sections of the specification used for both supporting the substrates and supplying thermal energy to the substrates during the vapor deposition.

To accommodate the pair of substrates 2701, 2702, two heater platens are configured with a length and width respectively fitted for the size and shape of the substrate and also in a side-by-side arrangement leaving a middle gap between them along the length direction. Although a single and bigger heater platen can be used, but two smaller sized platens are easier for manufacturing (including all embedded heating elements) and handling provided that each platen has already a length of more than 1 meter.

Also shown in this top view (FIG. 11), a shield structure is applied in some interior regions of the deposition chamber to cover the surfaces in those interior regions. The shield structure is designed for preventing vapor coating buildup in regions around the heater platens as the deposition process goes on. It is designed with a sheet structure having multiple parts that are easily assembled and removable. For example, a middle stripe-shaped sheet member 2170 is applied in the middle gap between the two heater platens to prevent the deposition vapor going through the middle gap of the two heater platens, which also provides a control of the vapor flow during the deposition to achieve a better uniformity in thin film deposition. The shield structure parts can be easily replaced after certain processing times to enhance manufacture efficiency by reducing down time of the apparatus.

Figure 12:
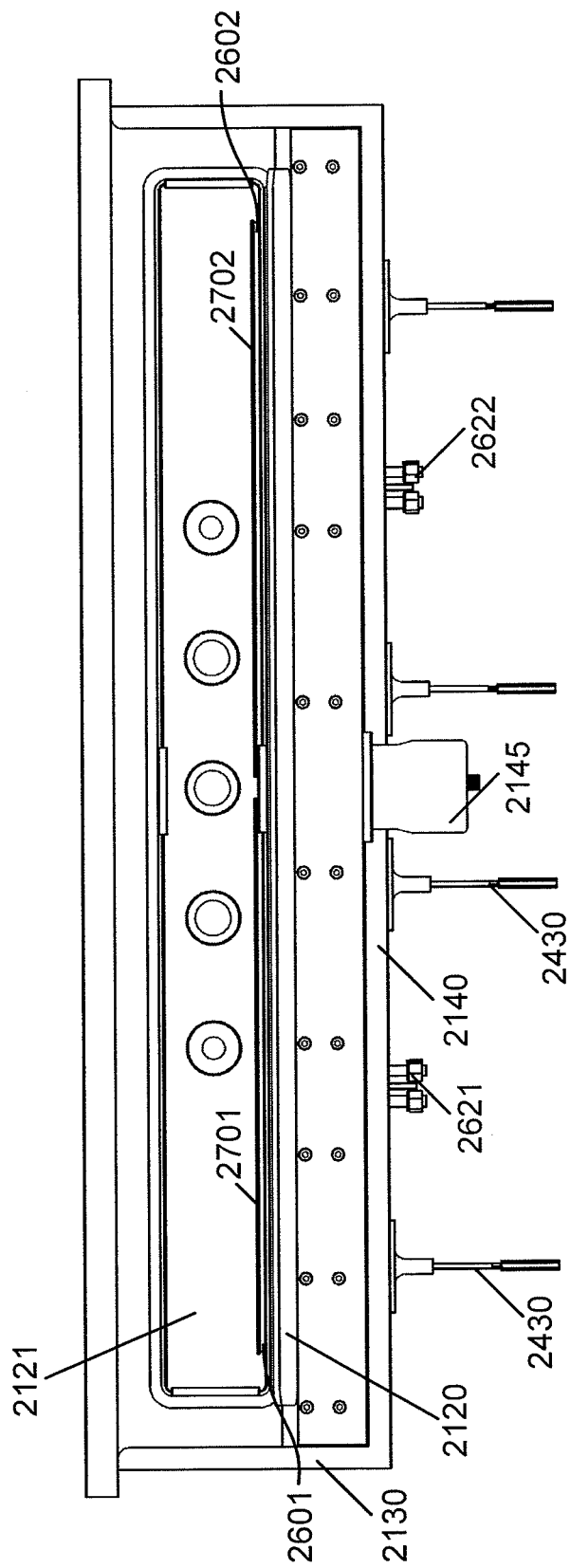
FIG. 12 shows a side view of the apparatus in FIG. 11 for manufacturing thin film photovoltaic devices according to the embodiment of the present invention.

FIG. 12 shows a side view of the apparatus in FIG. 11 for manufacturing thin film photovoltaic devices according to the embodiment of the present invention. The side view is from the side wall that contains a door structure 2120. As shown, through the door opening 2121, the substrates 2701 and 2702 are respectively supported by the heater platens 2601 and 2602 in a loading position with a substantially intimate contact between a bottom face of each substrate and a top surface of each heater platen. In a specific embodiment, the length and the width of the heater platen is respectively made smaller than the length and the width of the substrate by a substantially small value so that the substrate including its peripheral edge regions, in the loading position shown above, is extended over all top surface of the heater platen including its peripheral edge regions. Physically, this avoids any exposure of the top surface of the heater platen to the vapor material supplied from a top lid member of the deposition chamber. Further details about one or more configurations of the heater platen relative to the substrate for transfer thermal energy uniformly to the latter can be found through the specification and specifically in sections below.

Also shown in FIG. 12, a base member 2140 of the deposition chamber is configured to arrange multiple devices within a surface of the base member and an extended space below the surface. In a specific embodiment, a plurality of feedthrough structures 2430 is formed with a proper distribution in the surface of the base member. Each of the plurality of feedthrough structures 2430 includes a column structure formed to support the heater platen and leave a space between the bottom regions of the two heater platen and an interior region of the base member. Each of the plurality of feedthrough structures 2430 also includes a movable pin that is able to travel up and down passing through both the base member via a vacuum sealed structure and the heater platens via a built-in hole. Therefore, a plurality of the movable pins can move, under controlled by a lifting structure (see FIG. 2 and FIG. 5), together up to a distance above the top surface of the heater platen to lift a substrate there so that the substrate can be unloaded or to make these pins ready for receive a loaded substrate. Additionally, the base member 2140 also includes two devices 2621 and 2622 respectively for connecting with the heating elements embedded within the two heater platens 2601 and 2062. In a specific embodiment, the two devices are configured to supply a heating fluid into a respective embedded pipe arranged in certain geometric configuration inside the heater platens for providing thermal energy. The geometric configuration is associated with the side-by-side configuration of the two heater platens 2601 and 2602. For example, each device (e.g., 2601) has two independent inlets that guide the heating fluid to two independent pipes arranged in different regions of one of the two heater platens so that the combined heating effect for each heater platen is substantially uniform. Moreover, a pump module may be coupled to the deposition chamber through a valve device 2145.

Figure 13A:
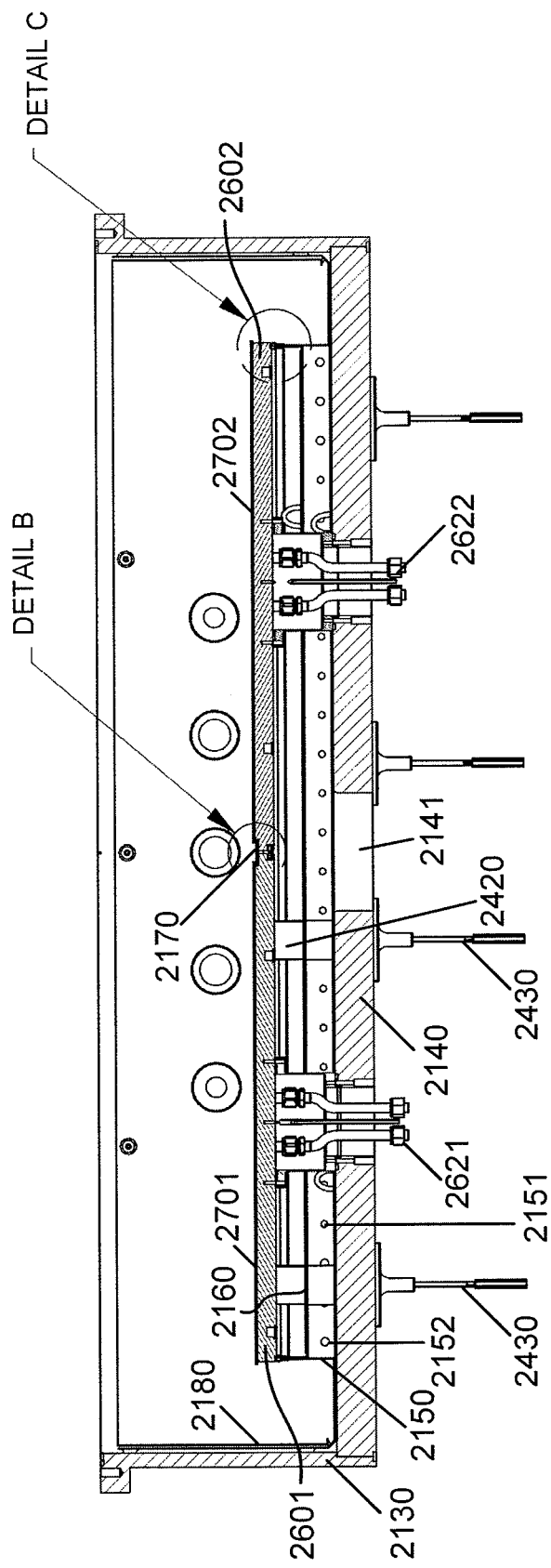
FIG. 13A shows a section (AA) view of the apparatus in FIG. 11 for manufacturing thin film photovoltaic devices according to the embodiment of the present invention.

FIG. 13A shows a section (AA) view of the apparatus in FIG. 11 for manufacturing thin film photovoltaic devices according to the embodiment of the present invention. The section (AA) view provides additional structural and configurational information about the apparatus. As shown, it reveals more clearly that the heater platen (e.g., 2601) is designated to be slightly smaller in size than the substrate (2701) it supports. It also shows clearly the heating fluid inlets 2621 connecting from a space below the base member 2140 to (heating elements of) the heater platen 2601. Also revealed in FIG. 13A are several strut structures 2420 standing between the heater platen 2601 or 2602 and the base member, which also each includes an internal feedthrough structure that is fed with a lifting pin 2430 for lifting the substrate above the top surface of the heater platen.

Additionally, FIG. 13A further reveals a removable shield structure disposed as multiple parts at different regions inside the deposition chamber. A first part 2180 of the shield structure is a sheet structure covering all the side wall regions of the deposition chamber. A second part 2160 is a flat sheet structure covering bottom regions of the exposed heater platen (and associated supporting structure). A third part 2150 is a skirt structure vertically surrounding outer peripheral side regions of the side-by-side configuration of the two heater platens. An extended portion of the third part 2150 also covers a small portion of the base member. A fourth part 2170 is a narrow stripe-shaped sheet member inserted between the middle gap of the two heater platens in the side-by-side configuration. Between the second part 2160 of the shield structure and the base member there is a space with a height being substantially isolated from the heater platen. As shown, in the third part 2150 of the shield structure there are multiple holes, 2151 and 2152 and more, formed within the height that connect the space to the rest part of the deposition chamber. These holes create a pathway to guide residue reactant vapor materials supplied into the deposition chamber towards the space near the base member. An exit port 2141 can be built near a centre region in the base member to connect of the space to a valve device (2145 in FIG. 12). Therefore, a downstream flow of any remained reactant vapor materials can be guided over the outer peripheral side regions and into the space before being pumped out by a pump device (not shown) coupled to the valve device 2145.

Figure 13B:
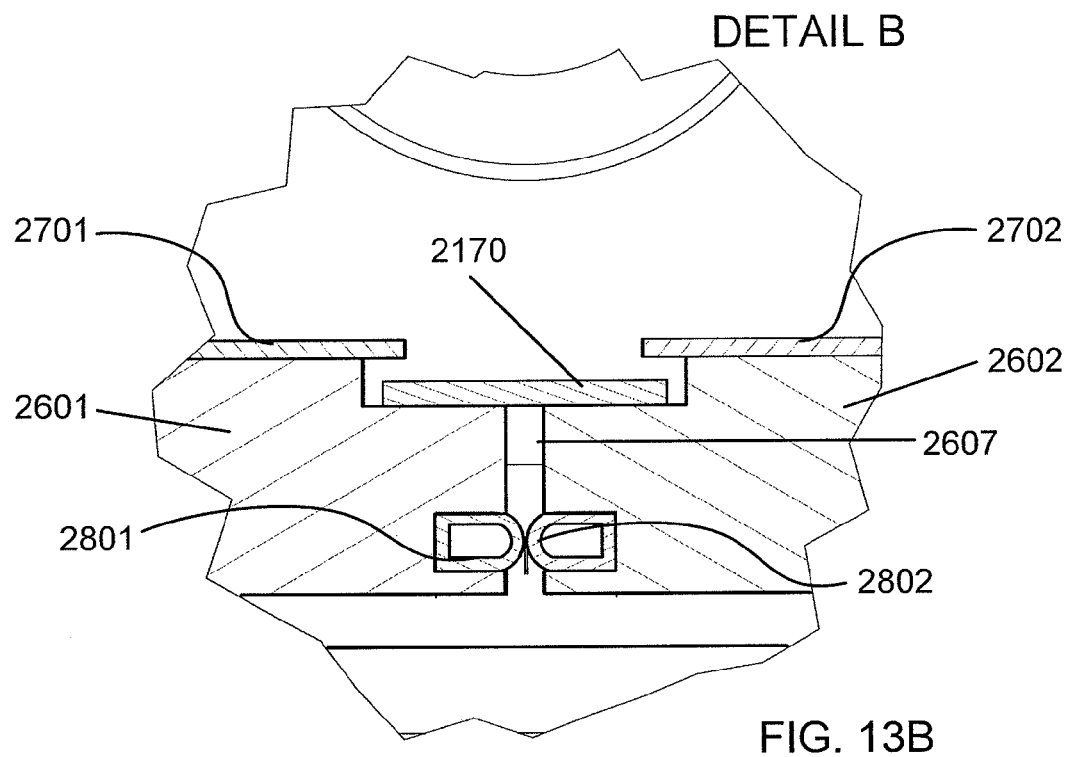
FIG. 13B shows a detailed section view of the apparatus in FIG. 13A according to the embodiment of the present invention.

Further details about the middle gap between two heater platens are described below. FIG. 13B shows a detail B section view of the apparatus in FIG. 13A according to the embodiment of the present invention. As shown, FIG. 13B reveals the middle gap structure including the fourth part of shield structure inserted to cover the gap 2607 between the heater platen 2601 and heater platen 2602. From FIG. 11, the gap 2607 is along the length direction of two heater platens. In a specific embodiment, the middle gap structure is formed with a recessed edge portion for each heater platen along the length, allowing a width of stripe-shaped sheet member 2170 to be able to fit in with certain room for accommodating thermal expansion. The sheet member 2170 is intended to substantially prevent from coating buildup in the gap region, while the gap 2607 is further gas-sealed by two elastomers. One elastomer 2801 is inserted in a side slot of the heater platen 2601 and another elastomer 2802 is inserted in another side slot of the heater platen 2602, facing each other. In an example, the elastomer is made by silicone rubber, which is susceptible to temperatures above 200° C. and is a good thermal insulator. The two elastomers become pressed sufficiently tight when both heater platens are in their respective positions in this side-by-side configuration. The gas-sealed elastomers structure above substantially prevents any gas or vapor flow through the middle gap 2607 and in turn improve a stability of the reactant vapor stream that is downwardly supplied from the top member of the deposition chamber and is guided more uniformly from middle portion of the loaded substrates towards peripheral edge regions.

Figure 13C:
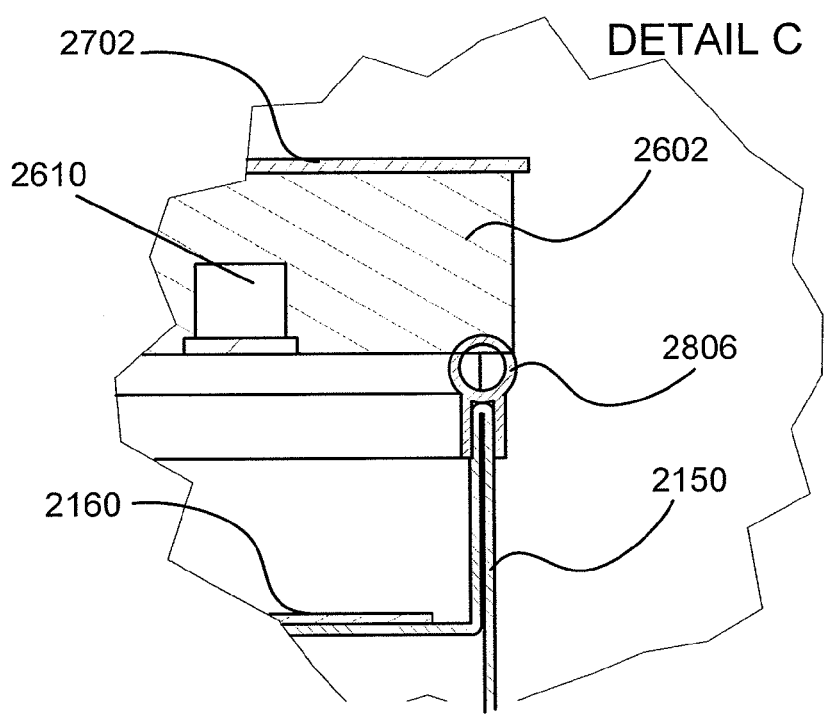
FIG. 13C shows another detailed section view of the apparatus in FIG. 13A according to the embodiment of the present invention.

Another detailed structure information about the heater platen engaging with the skirt structure 2150 of the shield structure near the edge region is shown in FIG. 13C. As shown, FIG. 13C reveals an edge region structure where a skirt structure 2150 couples with the heater platen 2602 near its peripheral edge. In a specific embodiment, an elastomer 2806 is disposed at a tip position of the skirt structure 2150 to engage with bottom portion of the heater platen 2602 near its edge. The rounded portion of the elastomer 2806 is shown in an un-pressed state. When the heater platen 2602 and the skirt structure 2150 are respectively in their position, the elastomer 2806 is pressed to seal a pathway into the bottom region of the heater platen from the peripheral side region. The elastomer 2806 is made by silicone rubber which is also a good thermal insulator for reducing the heating of the shield structure and hence deposition buildup thereon. FIG. 13C also clearly reveal a portion of the heating element 2610 embedded inside the heater platen 2602. As mentioned earlier, one embodiment of the heating element 2610 is a pipe structure configured to allow a heating fluid to flow through carrying thermal energy to the substrate.

In an implementation of the present invention, the configuration of using a heater platen with a slightly reduced size to support the substrate provides at least three benefits for performing vapor deposition for forming a ZnO coating on thin-film absorber material on the substrate: 1) preventing possible film flake off from the heater platen due to coating buildup; 2) preventing formation of any edge lip due to coating buildup on the heater platen to cause wedging effect when the loaded substrate partially sits on the edge lip that results in poor thermal contact; 3) reducing unnecessary consumption of the reactant vapor materials that deposit on any exposed area of the heater platen. A potential drawback of using the heater platen with reduced size is to cause possible poorer ZnO film uniformity at the peripheral edge of the substrate. However, since about half inch of the peripheral edge film must be subsequently removed for edge isolation during module lamination, perfect film uniformity up to the very edge of the substrate is not required. Along the length direction (about 165 cm), there is additional about 5 mm zone on each side of the substrate the overlying films including the ZnO film are removed from back electrode. Hence, on the length edges, ZnO film quality is unimportant for about 17-18 mm inward from the edge.

In an alternative implementation, to prevent vapor gas leaking between the heater platens directly to the process pump port located at the central position of the base member, a gap shield is attached to prevent possible film deposition uniformity due to a distortion to vapor flow caused by the middle gap leaking The shield structure is positioned to prevent gas flow, but at a distance to reduce heating from the heater platen and hence deposition buildup thereon. Alternatively, the shield structure is connected to the heater platen via insulating adaptors, reducing radiation and convention heating of the covered regions.

It is understood that the examples and embodiments described herein are for illustrative purposes only and that various modifications or changes in light thereof will be suggest to persons skilled in the art and are to be included within the spirit and purview of this application and scope of the appended claims. Although the above has been generally described in terms of a specific structure for CIS and/or CIGS thin film cells, other specific CIS and/or CIGS configurations can also be used, such as those noted in issued U.S. Pat. Nos. 4,611,091 and 4,612,411, which are hereby incorporated by reference herein, without departing from the invention described by the claims herein.

What is claimed is:

1. An apparatus for fabricating thin film photovoltaic devices, the apparatus comprising:
   a deposition chamber having a top member and a base member connected by a plurality of side walls, at least one of the plurality of side walls having a door structure configured to load and unload a pair of substrates side-by-side, each substrate having a rectangular shape with a first width and first length;
   two heater platens disposed in the deposition chamber in a side-by-side configuration with a middle gap, each of the two heater platens having a second width, a second length, and a top surface configured to form an intimate contact with a bottom face of one of the pair of substrates and to supply thermal energy to the substrate in a vapor deposition, the second width and the second length being respectively made smaller than the first width and the first length by a substantially small value so that the top surface of the heater platen including a peripheral edge region is substantially covered by the substrate to prevent formation of any edge lip due to coating buildup near the peripheral edge region from the vapor deposition, wherein each of the two heater platens is supported by a plurality of strut structures on the base member, each of the plurality of struts structures being aligned to a through-hole in the heater platen allowing a lifting pin in the strut structure to at least partially pass through to a distance beyond the top surface of the heater platen for lifting the substrate to a distance above the top surface of the heater platen; and
   a shield structure comprising a stripe-shaped sheet structure and a surrounding skirt structure for substantially preventing the heater platen from coating by the vapor deposition, the stripe-shaped sheet structure being inserted above the middle gap, the surrounding skirt structure being disposed to at least cover substantially all outer peripheral regions of the side-by-side configuration of the two heater platens.

2. The apparatus of claim 1 wherein the top member comprises a gas distributor configured to supply vapor precursor materials downward over the pair of substrates during the vapor deposition, the pair of substrates including a thin-film photovoltaic absorber material.

3. The apparatus of claim 2 wherein the vapor precursor materials comprise a gaseous mixture of pure Nitrogen gas, water vapor, vapor of Diethelyzinc (DEZ) liquid, and Diborane mixed with Nitrogen gas, the gaseous mixture being transformed into a solid ZnO film overlying the thin-film photovoltaic absorber material.

4. The apparatus of claim 2 further comprises two first elastomers disposed respectively in two trenches on the two sides of the heater platens facing in the middle gap and one or more second elastomers disposed at top ridges of the surrounding skirt structure, the two first elastomers being pressed together to seal the middle gap and the one or more second elastomers being engaged with the heater platens to seal a pathway from any side regions of the heater platens to a bottom region of the heater platens, thereby substantially preventing the vapor precursor materials to flow through the middle gap and any side regions.

5. The apparatus of claim 1 wherein each of the two heater platens comprises embedded heating elements symmetrically arranged to supply thermal energy substantially uniformly via the intimate contact from the two heater platens in the side-by-side configuration to the pair of substrates.

6. The apparatus of claim 1 wherein the distance is substantially leveled with a substrate loading level associated with the door structure configured to load in/out a pair of substrates side-by-side in the deposition chamber.

7. The apparatus of claim 4 wherein the shield structure further comprises a shaped sheet member disposed at an inner region of the surrounding skirt structure and supported by part of the surrounding skirt structure for separating the base member from the bottom region of the heater platens.

8. The apparatus of claim 7 wherein the surrounding skirt structure comprises a number of through-holes distributed at a position between the shaped sheet structure and the base member for providing a downstream pathway to the vapor precursor materials flowing over the outer peripheral regions of the side-by-side configuration of the two heater platens to a central region beneath the shaped sheet member before being removed by a pump device connected to the central region through the base member.

9. The apparatus of claim 1 wherein the surrounding skirt structure further comprises extended sheet members to cover all inner regions of the side walls and a portion of the base member to prevent the deposition chamber from the coating of the vapor deposition.

10. The apparatus of claim 1 wherein the first length is about 165 cm and greater and the first width is about 65 cm and greater, the second length is a few mm less than the first length and the second width is a few mm less than the first width.

11. An apparatus for fabricating thin film photovoltaic devices, the apparatus comprising:
a deposition chamber including a lid and base opposite the lid, wherein the lid includes a first wall coupled between the lid and base, wherein the first wall defines a space for receiving at least two substrates side-by-side;
two heater platens positioned proximate one another within the deposition chamber between the lid and base, each of the two heater platens configured to individually support a substrate, wherein the two heater platens define a middle gap between the two heater platens, wherein the middle gap extends within the chamber between the two heater platens such that when substrates are loaded on the two heater platens, the middle gap extends between the two substrates, and wherein the two heater platens comprise heating mechanisms coupled with the two heater platens; and
a shield structure comprising a first portion positioned above the middle gap and a second portion positioned circumferentially around the two heater platens and positioned at least partially below the heater platens between the two heater platens and the base.

12. The apparatus of claim 11, wherein the heating mechanisms comprise individual heating mechanisms that do not extend between the two heater platens.

13. The apparatus of claim 12, wherein each of the heating mechanisms comprises channels defined within each of the two heater platens, and wherein the channels extend to individual entrance and exit ports disposed separately within the two heater platens.

14. An apparatus for fabricating thin film photovoltaic devices, the apparatus comprising:
a deposition chamber including a lid and base opposite the lid, wherein the lid includes a first wall coupled between the lid and base, wherein the first wall defines a space for receiving at least two substrates side-by-side;
two heater platens positioned proximate one another within the deposition chamber between the lid and base, each of the two heater platens configured to individually support a substrate, wherein the two heater platens define a middle gap between the two heater platens, wherein the middle gap extends within the chamber between the two heater platens such that when substrates are loaded on the two heater platens, the middle gap extends between the two substrates, and wherein the two heater platens comprise heating mechanisms coupled with the two heater platens;
a plurality of strut structures extending between the base and at least one of the two heater platens, and coupled with at least one of the two heater platens; and
a shield structure comprising a first portion positioned above the middle gap and a second portion positioned circumferentially around the plurality of strut structures between the two heater platens and the base.

15. The apparatus of claim 14, wherein each of the plurality of struts defines a strut aperture, wherein the base defines a plurality of base apertures each axially aligned with a strut aperture, and wherein the two heater platens define a plurality of platen apertures each axially aligned with a strut aperture.

16. The apparatus of claim 15, further comprising a plurality of lift pins, each lift pin extending through a strut aperture, base aperture, and platen aperture.

17. The apparatus of claim 16, wherein each lift pin is coupled with a lift mechanism positioned below the deposition chamber base.

18. The apparatus of claim 14, wherein the second portion of the shield structure extends vertically between the base and the heater platens, and wherein the shield structure further comprises a third portion positioned horizontally between the base and the two heater platens, and positioned at a height between the height of the base and the two heater platens.

19. The apparatus of claim 14, wherein the second portion of the shield structure defines a plurality of apertures.

20. The apparatus of claim 14, wherein the first portion of the shield structure is coupled with an upper region of each of the two heater platens, and wherein each of the two heater platens defines a sidewall channel in a sidewall of the heater platen proximate the other heater platen, and wherein the apparatus further comprises at least two elastomeric members, each of the at least two elastomeric members positioned within one of the two sidewall channels, and wherein each of the at least two elastomeric members contacts an elastomeric member positioned within the other sidewall channel.

* * * * *